(12) United States Patent
Kitagawa

(10) Patent No.: US 8,076,749 B2
(45) Date of Patent: Dec. 13, 2011

(54) SEMICONDUCTOR DEVICE

(75) Inventor: Mitsuhiko Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 12/030,674

(22) Filed: Feb. 13, 2008

(65) Prior Publication Data
US 2008/0315343 A1    Dec. 25, 2008

(30) Foreign Application Priority Data

Feb. 13, 2007 (JP) ................................ 2007-032119
Feb. 8, 2008 (JP) ................................ 2008-029716

(51) Int. Cl.
*H01L 29/06* (2006.01)
(52) U.S. Cl. ......... 257/488; 257/168; 257/170; 257/487
(58) Field of Classification Search ................ 257/168, 257/170, 487, 488, 600, E29.01
See application file for complete search history.

(56) References Cited

U.S. PATENT DOCUMENTS

| | | | | |
|---|---|---|---|---|
| 5,315,139 A * | 5/1994 | Endo | ............................. | 257/409 |
| 5,324,971 A * | 6/1994 | Notley | ............................. | 257/328 |
| 5,343,067 A * | 8/1994 | Nakagawa et al. | ............. | 257/487 |
| 5,434,444 A * | 7/1995 | Nakagawa et al. | ............. | 257/487 |
| 5,714,396 A * | 2/1998 | Robb et al. | ...................... | 438/510 |
| 6,150,702 A * | 11/2000 | Funaki et al. | ................... | 257/409 |
| 6,246,101 B1 * | 6/2001 | Akiyama | ........................ | 257/508 |
| 6,667,515 B2 * | 12/2003 | Inoue | ............................ | 257/341 |
| 6,737,727 B2 * | 5/2004 | Gates et al. | ..................... | 257/531 |
| 6,870,200 B2 * | 3/2005 | Yanagisawa | .................... | 257/139 |
| 6,879,005 B2 * | 4/2005 | Yamaguchi et al. | ........... | 257/367 |
| 6,958,526 B2 * | 10/2005 | Gates et al. | ..................... | 257/642 |
| 7,049,186 B2 * | 5/2006 | Yanagisawa | .................... | 438/183 |
| 7,125,780 B2 * | 10/2006 | Akiyama et al. | ............... | 438/359 |
| 7,135,752 B2 * | 11/2006 | Akiyama et al. | ............... | 257/501 |
| 7,196,397 B2 * | 3/2007 | Chiola et al. | .................... | 257/531 |
| 7,368,785 B2 * | 5/2008 | Chen et al. | ...................... | 257/341 |
| 2005/0127470 A1 * | 6/2005 | Akiyama et al. | ............... | 257/506 |
| 2005/0230777 A1 * | 10/2005 | Chiola et al. | .................... | 257/480 |
| 2005/0253170 A1 * | 11/2005 | Akiyama | ........................ | 257/211 |
| 2006/0138586 A1 * | 6/2006 | Akiyama et al. | ............... | 257/506 |

FOREIGN PATENT DOCUMENTS

JP             06-077470             3/1994

* cited by examiner

*Primary Examiner* — Leonardo Andujar
*Assistant Examiner* — Jordan Klein
(74) *Attorney, Agent, or Firm* — Turocy & Watson, LLP

(57) ABSTRACT

A semiconductor device includes: a first insulating layer; a semiconductor layer provided on the first insulating layer; a first semiconductor region selectively provided in the semiconductor layer; a second semiconductor region selectively provided in the semiconductor layer and spaced from the first semiconductor region; a first main electrode provided in contact with the first semiconductor region; a second main electrode provided in contact with the second semiconductor region; a second insulating layer provided on the semiconductor layer; a first conductive material provided in the second insulating layer above a portion of the semiconductor layer located between the first semiconductor region and the second semiconductor region; and a second conductive material provided in a trench provided in a portion of the semiconductor layer opposed to the first conductive material, being in contact with the first conductive material, and reaching the first insulating layer.

14 Claims, 24 Drawing Sheets

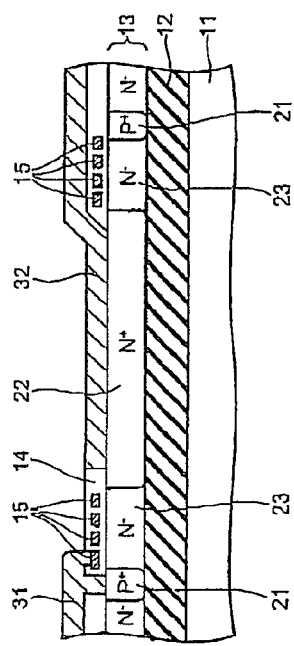
FIG. 1A
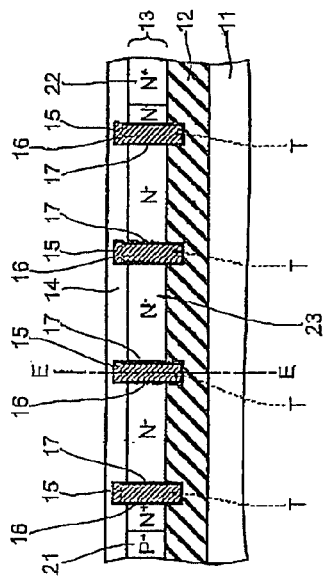
FIG. 1B
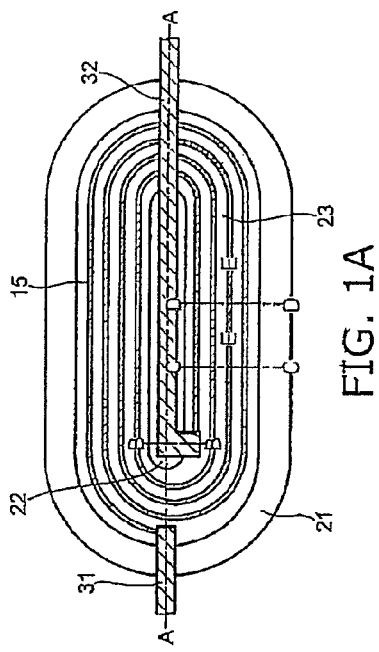
FIG. 1C
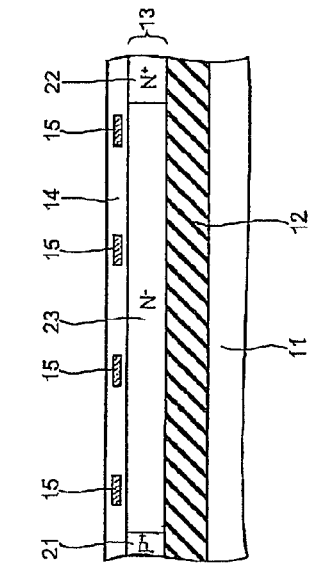
FIG. 1D
FIG. 1E
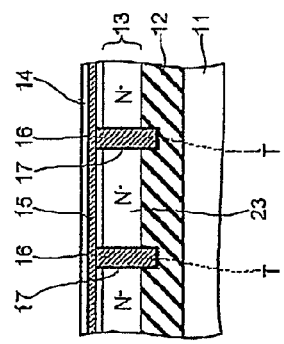
FIG. 1F

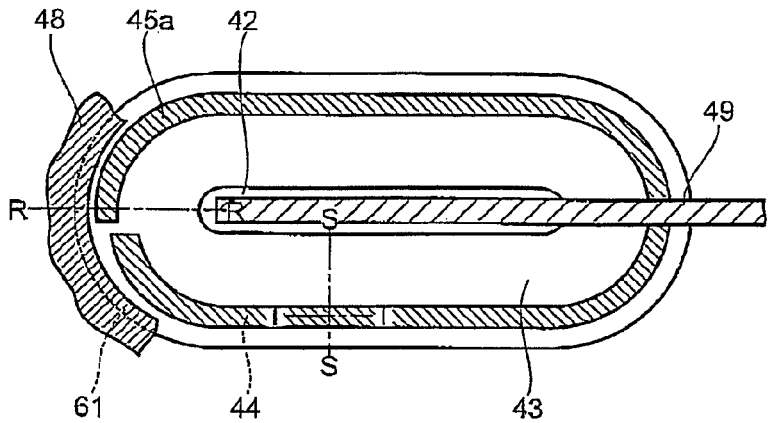
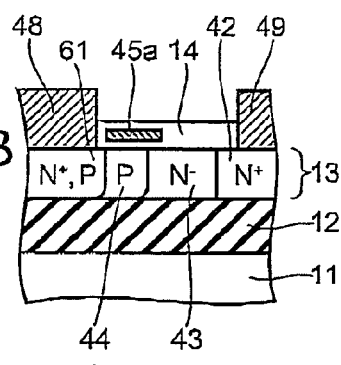
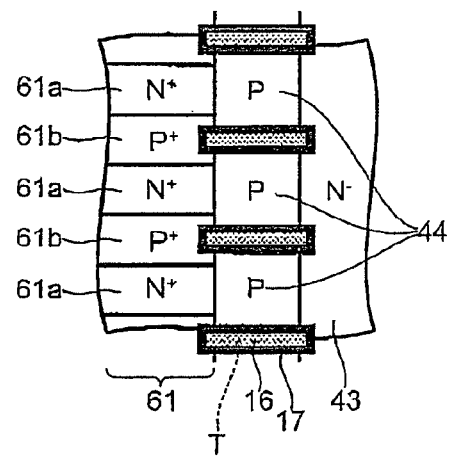
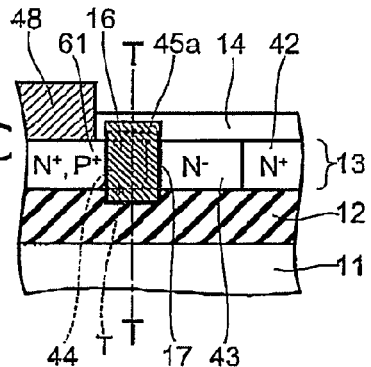
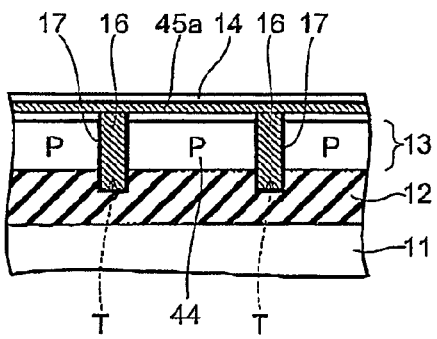

SEMICONDUCTOR DEVICE

CROSS-REFERENCE TO RELATED APPLICATION

This application is based upon and claims the benefit of priority from the prior Japanese Patent Application No. 2007-032119, filed on Feb. 13, 2007 and the prior Japanese Patent Application No. 2008-029716, filed on Feb. 8, 2008; the entire contents of which are incorporated herein by reference.

BACKGROUND OF THE INVENTION

1. Field of the Invention
This invention relates to a semiconductor device.
2. Background Art
A conventionally known structure for enhancing breakdown voltage includes a field plate electrode opposed to the frontside of a semiconductor layer across an insulating layer (see, e.g., Japanese Patent No. 3207615). This Japanese patent also discloses using part of the field plate electrode as a gate electrode so as to be opposed to a base region.

For the purpose of further enhancing breakdown voltage and reducing ON resistance, it is theoretically possible to include a field plate electrode and a gate electrode also on the backside of the semiconductor layer so as to be opposed thereto. However, this configuration complicates the extraction structure for the electrodes provided on the backside. Hence it is currently difficult to stably obtain such a configuration, and development of a new device design is expected.

SUMMARY OF THE INVENTION

According to an aspect of the invention, there is provided a semiconductor device including: a first insulating layer; a semiconductor layer provided on the first insulating layer; a first semiconductor region selectively provided in the semiconductor layer; a second semiconductor region selectively provided in the semiconductor layer and spaced from the first semiconductor region; a first main electrode provided in contact with the first semiconductor region; a second main electrode provided in contact with the second semiconductor region; a second insulating layer provided on the semiconductor layer; a first conductive material provided in the second insulating layer above a portion of the semiconductor layer located between the first semiconductor region and the second semiconductor region; and a second conductive material provided in a trench provided in a portion of the semiconductor layer opposed to the first conductive material, being in contact with the first conductive material, and reaching the first insulating layer.

According to other aspect of the invention, there is provided a semiconductor device including: an insulating layer; a semiconductor layer provided on the insulating layer; a first semiconductor region selectively provided in the semiconductor layer; a second semiconductor region selectively provided in the semiconductor layer and spaced from the first semiconductor region; a first main electrode provided in contact with the first semiconductor region; a second main electrode provided in contact with the second semiconductor region; a conductive material selectively provided at least in a portion that is not opposed to the semiconductor layer, in the insulator layer.

BRIEF DESCRIPTION OF THE DRAWINGS

FIG. 1A is a schematic view illustrating the planar structure of the main part of a semiconductor device according to a first embodiment of the invention.

FIG. 1B is a cross-sectional view taken along the line A-A in FIG. 1A.

FIG. 1C is a cross-sectional view taken along the line B-B in FIG. 1A.

FIG. 1D is a cross-sectional view taken along the line C-C in FIG. 1A.

FIG. 1E is a cross-sectional view taken along the line D-D in FIG. 1A.

FIG. 1F is a cross-sectional view taken along the line E-E in FIGS. 1A and 1E.

FIG. 10A is a schematic view illustrating the planar structure of the main part of the semiconductor device according to an eighth embodiment of the invention.

FIG. 10B is a cross-sectional view taken along the line R-R in FIG. 10A.

FIG. 10C is a cross-sectional view taken along the line S-S in FIG. 10A.

FIG. 10D is a cross-sectional view taken along the line T-T in FIGS. 10A and 10C.

FIG. 10E is a schematic view showing an example planar pattern of the main part in FIGS. 10A-10C.

DETAILED DESCRIPTION OF THE INVENTION

Figure 2:
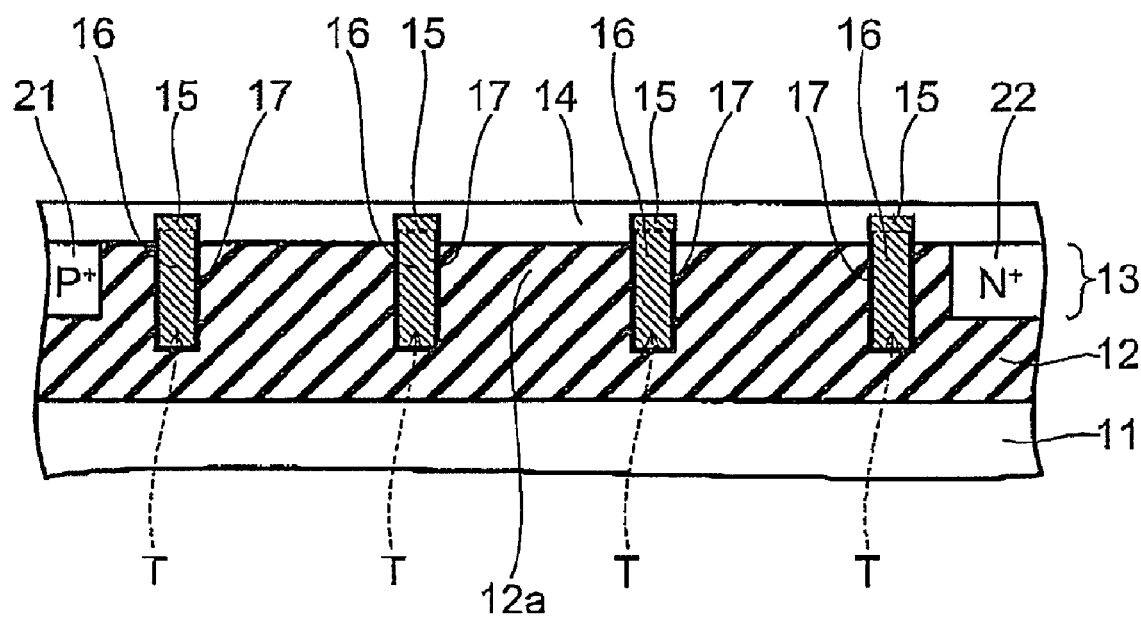
FIG. 2 is a schematic cross-sectional view showing a variation of the semiconductor device according to the first embodiment.

Embodiments of the invention will now be described with reference to the drawings. Like components in the drawings are marked with like reference numerals, and the description thereof may be omitted.

First Embodiment

This embodiment is described with reference to FIG. 1 taking a diode formed in an SOI (silicon on insulator) layer as an example of the semiconductor device. More specifically, as shown in FIG. 1B, the semiconductor device according to this embodiment includes a semiconductor layer 13 above a semiconductor substrate 11 through the intermediary of a first insulating layer 12, and a PN junction structure is formed in the semiconductor layer 13. The semiconductor substrate 11 and the semiconductor layer 13 are illustratively made of silicon. The first insulating layer 12 is illustratively made of silicon oxide buried on the semiconductor substrate 11.

The semiconductor layer 13 is illustratively made of $N^-$-type silicon. A first semiconductor region 21 illustratively made of $P^+$-type silicon and a second semiconductor region 22 illustratively made of $N^+$-type silicon are selectively formed in the semiconductor layer 13.

As shown in FIG. 1A, the first semiconductor region 21 is formed in a ring shape, for example, and the second semiconductor region 22 is formed inside and spaced from the first semiconductor region 21. A drift region 23 illustratively made of $N^-$-type silicon is formed in a ring shape between the first semiconductor region 21 and the second semiconductor region 22. The outer peripheral portion of the drift region 23 forms a PN junction with the inner peripheral portion of the first semiconductor region 21.

As shown in FIG. 1B, a second insulating layer 14 illustratively made of silicon oxide is provided on the semiconductor layer 13. A first main electrode 31 and a second main electrode 32 are selectively provided on the second insulating layer 14. The first main electrode 31 is in contact with the surface of the first semiconductor region 21 through a via formed through the second insulating layer 14. The second main electrode 32 is in contact with the surface of the second semiconductor region 22 through a via formed through the second insulating layer 14. Upon application of a forward voltage between the first main electrode 31 and the second main electrode 32, a current flows between these electrodes 31 and 32 through the first semiconductor region 21, the drift region 23, and the second semiconductor region 22. That is, the semiconductor device according to this embodiment is a so-called lateral semiconductor device in which a current flows in the direction generally parallel to the major surface of the semiconductor substrate 11.

A first conductive material (field plate portion) 15 is provided in the second insulating layer 14 located on the drift region 23. As shown in FIG. 1A, the first conductive material 15 is formed in a spiral shape. The first conductive material 15 is illustratively made of polycrystalline silicon or semi-insulated polycrystalline silicon (SIPOS), which is more resistive than the metal material, for example, used for the first main electrode 31 and the second main electrode 32.

As shown in FIG. 1B, one end of the first conductive material 15 is connected to the first main electrode 31. The other end of the first conductive material 15 is connected to the second main electrode 32 as shown in FIG. 1C, which is a cross section taken along line B-B in FIG. 1A. The first conductive material 15 is formed in a sufficiently long spiral so that leak current between the first main electrode 31 and the second main electrode 32 can be reduced to a practically negligible level. Depending on the selected material, the first conductive material 15 serving as a field plate electrode can be also shaped into other planar patterns such as a solid layer, besides the spiral.

Below the first conductive material 15, a plurality of trenches T are provided through the drift region 23 and are filled with a second conductive material. The trenches T are provided intermittently along the extending direction of the first conductive material 15. FIG. 1D shows a cross section taken along line C-C in FIG. 1A, where no trench is formed. FIG. 1E shows a cross section taken along line D-D in FIG. 1A, where a trench is formed.

As shown in FIG. 1E, the trench T passes through the drift region 23 and extends below the (upper) surface of the first insulating layer 12. After the trench T is formed, its inner wall surface (side surface and bottom surface) is oxidized to form an insulating film 17 of silicon oxide, and then the second conductive material 16 is buried in the trench T. The second conductive material 16 can be polycrystalline silicon, single crystal silicon, semi-insulated polycrystalline silicon (SI-POS), or metal, for example. The upper end of the second conductive material 16 buried in the trench T is in contact with the first conductive material 15. Alternatively, the second conductive material 16 and the first conductive material 15 may be integrally formed from the same material. In either case, the first conductive material 15 and the second conductive material 16 are electrically connected to each other. The bottom of the trench T and the second conductive material 16 is located, in FIG. 1E, below the boundary surface between the drift region 23 and the first insulating layer 12, that is, on the first insulating layer 12 side of the boundary surface. In this embodiment, the bottom of the trench T and the second conductive material 16 is located near the surface of the first insulating layer 12.

As shown in FIG. 1F, which is a cross section taken along line E-E in FIGS. 1A and 1E, a plurality of trenches T and second conductive materials 16 buried therein are provided intermittently along the extending direction of the first conductive material 15.

The ends of the first conductive material 15 are connected to the first main electrode 31 and the second main electrode 32, respectively. Hence, during off in which a reverse bias is applied between the first main electrode 31 and the second main electrode 32, one end of the first conductive material 15 is placed generally at the same potential as the first semiconductor region 21, the other end is placed generally at the same potential as the second semiconductor region 22, and the portion of the first conductive material 15 other than its both ends is placed at a potential corresponding to the path length from the ends.

More specifically, as viewed along the path connecting between the first semiconductor region 21 and the second semiconductor region 22, the potential of the first conductive material 15 has a gradual distribution. The electric field from the first conductive material 15 allows the semiconductor layer 13 to also have a gradual potential distribution between the high-potential side and the low-potential side. Consequently, the breakdown voltage can be improved by preventing electric field concentration in the semiconductor layer 13.

The first conductive material 15 described above is effective at preventing electric field concentration on the first major surface side of the semiconductor layer 13 opposed to the first conductive material 15 across the second insulating layer 14. In this embodiment, as shown in FIG. 1E, the electric field of the first conductive material 15 can be exerted also on the second major surface side of the semiconductor layer 13 (the backside in contact with the first insulating layer 12) through the second conductive material 16 buried inside the trench T passing through the semiconductor layer 13.

According to this embodiment, without using a complicated and difficult process for providing a first conductive material 15 opposed to the second major surface of the semiconductor layer 13, the electric field from the second conductive material 16 (i.e., the electric field of the first conductive material 15), which passes through the semiconductor layer 13 and has an upper end connected to the first conductive material 15, can be guided around to the second major surface side of the semiconductor layer 13. Hence the potential distribution is made gradual also on the second major surface side of the semiconductor layer 13, and electric field concentration can be prevented. Furthermore, the effect of the potential of the substrate 11 on the semiconductor layer 13 can be reduced. This allows the first insulating layer (buried insulating layer) 12 to be thinned.

More specifically, in the semiconductor device (diode) according to this embodiment, during off in which a reverse bias is applied, the electric field from the first conductive material 15, the ends of which are connected to the first main electrode 31 and the second main electrode 32 and which has a gradual potential distribution along its path length, can be exerted not only from the first major surface side of the semiconductor layer 13 but also from the second major surface side thereof. For example, even if the first insulating layer 12 is thinned to prevent warpage of the semiconductor substrate 11, the potential of the semiconductor substrate 11 (e.g., ground potential) is prevented from affecting the semiconductor layer 13, and the potential distribution in the semiconductor layer 13 between the high-potential side and the low-potential side is made gradual. Thus electric field concentration can be prevented. Consequently, it can be expected to achieve a breakdown voltage determined by the characteristics inherent to the material (e.g., silicon).

Recently, the device performance has been enhanced using a thin film SOI structure not only in logic circuits, memories, and other VLSI (very large scale integrated circuit), but also in power devices or other discrete devices. However, the device design used in VLSI or other low breakdown voltage devices (the device breakdown voltage being several volts) cannot be directly applied to the device design of power devices that require a high breakdown voltage ranging from tens to thousands of volts. Hence it has been difficult to integrate both of them into one chip.

In contrast, this embodiment allows a diode and a MOSFET (metal-oxide-semiconductor field effect transistor) having a breakdown voltage ranging from several ten volts to more than a thousand volts to be realized even in a thin film SOI structure measuring 0.1 μm, for example, used in most advanced microprocessors. Thus a VLSI and a high breakdown voltage power device can be integrated into one chip. Consequently, it can be expected to create high added value such as reliable electrical isolation between a low breakdown voltage circuit and a high breakdown voltage circuit on a chip as well as digital control of a power device by a VLSI. Furthermore, it can be expected to integrate easily an electronic device and an optical device having waveguide whose width or thickness is illustratively about ½-1 wavelength of light (100 nm-1 μm).

In forming the trench T shown in FIG. 1E, a plurality of trenches T passing through the drift region 23 can be formed by selectively etching away only the portion of the drift region 23 where the trenches T are to be formed.

Alternatively, a slit-like trench, for example, is formed by selectively removing not only the portion to be formed into a trench T, but also the drift region 23 around the trench T. After a material to serve as a conductive material 16 is buried in the trench, the material is selectively etched away to leave the second conductive material 16 in a cylindrical shape. Then, as shown in FIG. 2, an insulating layer (illustratively made of silicon oxide) 12a can be buried between the second conductive materials 16. In this structure, the insulating layer 12a is interposed between a plurality of second conductive materials 16 formed along the path connecting between the first semiconductor region 21 and the second semiconductor region 22. The drift region 23 is left in the portion where the second conductive material 16 is not provided, and the conduction between the first semiconductor region 21 and the second semiconductor region 22 is ensured through the drift region 23.

Second Embodiment

This embodiment is described with reference to FIG. 3 taking a MOSFET formed in an SOI layer as an example of the semiconductor device.

In this embodiment, in a semiconductor layer 13 illustratively made of N−-type silicon, a third semiconductor region (base region) 44 illustratively made of P+-type silicon is formed in a ring shape, and a second semiconductor region (drain region) 42 illustratively made of N+-type silicon is formed inside and spaced from the third semiconductor region 44. In the surface of the third semiconductor region 44, a first semiconductor region (source region) 41 illustratively made of N-type silicon is formed in a ring shape. A drift region 43 illustratively made of N−-type silicon is formed in a ring shape between, and in contact with, the third semiconductor region 44 and the second semiconductor region 42.

A second insulating layer 14 illustratively made of silicon oxide is provided on the semiconductor layer 13. A first main electrode 48 and a second main electrode 49 are selectively provided on the second insulating layer 14. The first main electrode 48 is in contact with the surface of the first semiconductor region 41 and the third semiconductor region 44 through a via formed through the second insulating layer 14. The second main electrode 49 is in contact with the surface of the second semiconductor region 42 through a via formed through the second insulating layer 14.

Figure 3A:
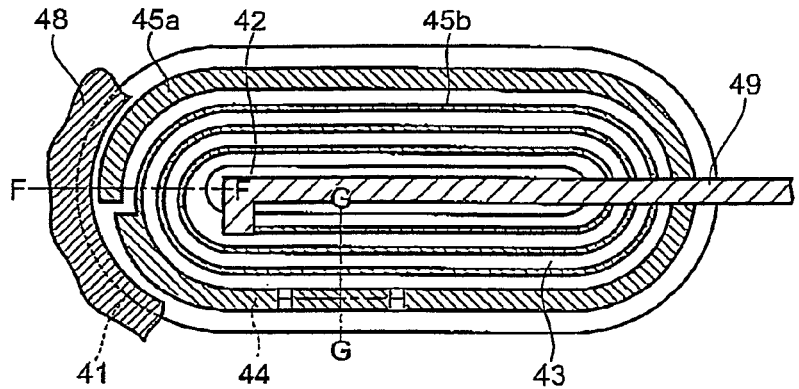
FIG. 3A is a schematic view illustrating the planar structure of the main part of the semiconductor device according to a second embodiment of the invention.
Figure 3B:
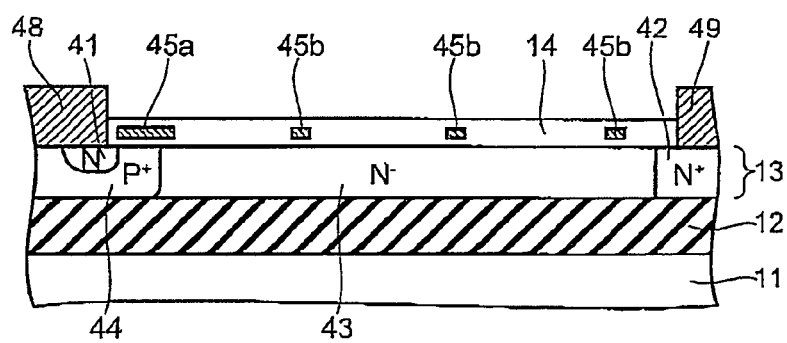
FIG. 3B is a cross-sectional view taken along the line F-F in FIG. 3A.

A field plate portion 45b is provided in the second insulating layer 14 located on the drift region 43, and a control electrode portion 45a is provided in the second insulating layer 14 located on the third semiconductor region 44. As shown in FIG. 3A, the control electrode portion 45a and the field plate portion 45b are concatenated and formed in a spiral shape. The control electrode portion 45a and the field plate portion 45b constitute a first conductive material in this embodiment.

As in the above first embodiment, the field plate portion 45b is illustratively made of polycrystalline silicon or semi-insulated polycrystalline silicon. As shown in FIG. 3A, one end of the field plate portion 45b is connected to the control electrode portion 45a. Alternatively, one end of the field plate portion 45b may be connected to the first main electrode 48. As in the first embodiment described with reference to FIG. 1C, the other end of the field plate portion 45b is connected to the second main electrode 49. The field plate portion 45b is formed in a sufficiently long spiral so that leak current between the control electrode portion 45a and the second main electrode 49 can be reduced to a practically negligible level.

The third semiconductor region 44 and the first semiconductor region 41 selectively formed in the surface thereof are formed in a ring shape so as to surround the drift region 43.

The control electrode portion 45a is formed in a ring shape on the portion of the third semiconductor region 44 located between the first semiconductor region 41 and the drift region 43 so as to surround the outside of the field plate portion 45b.

In this embodiment, while a voltage is applied between the first main electrode 48 and the second main electrode 49 so that the second main electrode 49 has a higher potential than the first main electrode 48, upon application of a desired control voltage to the control electrode portion 45a, a channel is formed in the third semiconductor region 44 opposed to the control electrode portion 45a, and a current flows between the electrodes 48 and 49 through the first semiconductor region 41, the channel, the drift region 43, and the second semiconductor region 42. The semiconductor device according to this embodiment is also a so-called lateral semiconductor device in which a current flows in the direction generally parallel to the major surface of the semiconductor substrate 11.

Figure 3C:
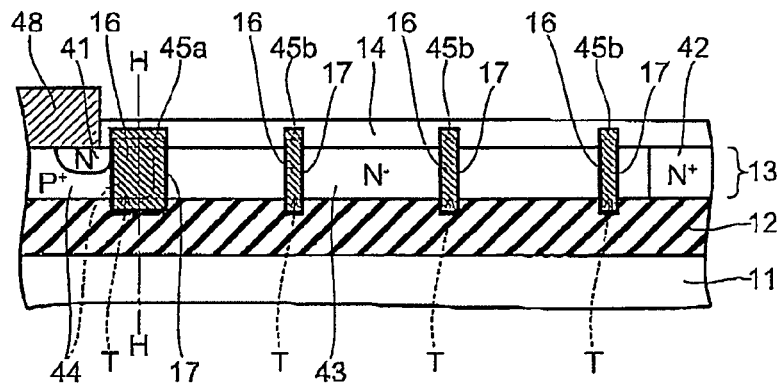
FIG. 3C is a cross-sectional view taken along the line G-G in FIG. 3A.

Also in this embodiment, as in the first embodiment, a plurality of trenches T are selectively formed in the portion of the drift region 43 located below the field plate portion 45b as shown in FIG. 3C. A second conductive material 16 is buried in the trench T through the intermediary of a silicon oxide film 17.

Figure 3D:
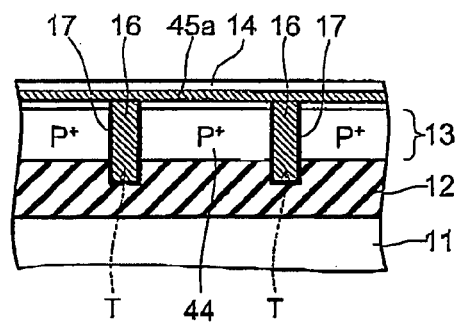
FIG. 3D is a cross-sectional view taken along the line H-H in FIGS. 3A and 3C.

Furthermore, in this embodiment, a plurality of trenches T are selectively formed also in the portion of the third semiconductor region 44 located below the control electrode portion 45 a as shown in FIG. 3C and FIG. 3D, which is a cross-sectional view taken along line H-H in FIG. 3C. A second conductive material 16 is buried in the trench T through the intermediary of a silicon oxide film 17. The second conductive material 16 can be polycrystalline silicon, single crystal silicon, or metal, for example.

The trench T formed below the field plate portion 45b passes through the drift region 43 and extends below the surface of the first insulating layer 12. The trench T formed below the control electrode portion 45a passes through the third semiconductor region 44 and extends below the surface of the first insulating layer 12.

The upper end of the second conductive material 16 buried in the trench T below the field plate portion 45b is in contact with, and electrically connected to, the field plate portion 45b. The upper end of the second conductive material 16 buried in the trench T below the control electrode portion 45a is in contact with, and electrically connected to, the control electrode portion 45a.

The bottom of the trench T and the second conductive material 16 below the field plate portion 45b is located, in FIG. 3C, below the boundary surface between the drift region 43 and the first insulating layer 12, that is, on the first insulating layer 12 side of the boundary surface. The bottom of the trench T and the second conductive material 16 below the control electrode portion 45a is located, in FIG. 3C, below the boundary surface between the third semiconductor region 44 and the first insulating layer 12, that is, on the first insulating layer 12 side of the boundary surface.

In this embodiment, one end of the field plate portion 45b connected to the control electrode portion 45a or the first main electrode 48 is placed at a lower potential than that of the other end connected to the second main electrode 49. Conversely, the other end of the field plate portion 45b is placed at a higher potential than that of the one end. The portion of the field plate portion 45b other than its both ends is placed at a potential corresponding to the path length from the ends.

In this embodiment, one end of the field plate portion 45b connected to the control electrode portion 45a or the first main electrode 48 is set to have a lower potential than that of the other end connected to the second main electrode 49, and conversely, the other end of the field plate portion 45b is set to be have a higher potential than that of the one end. The portion except for the both ends of the field plate portion 45b is set to have a potential according to the path length.

More specifically, also in this embodiment, as viewed along the path connecting between the first semiconductor region 41 and the second semiconductor region 42, the potential of the field plate portion 45b has a gradual distribution. The electric field from the field plate portion 45b allows the semiconductor layer 13 to also have a gradual potential distribution between the high-potential side (the second main electrode 49 side in this embodiment) and the low-potential side (the first main electrode 48 side in this embodiment). Consequently, the breakdown voltage can be improved by preventing electric field concentration in the semiconductor layer 13.

The field plate portion 45b is particularly effective at preventing electric field concentration on the first major surface side of the semiconductor layer 13 opposed to the field plate portion 45b across the second insulating layer 14. Also in this embodiment, as shown in FIG. 3C, the electric field of the field plate portion 45b can be exerted also on the second major surface side of the semiconductor layer 13 (the backside in contact with the first insulating layer 12) through the second conductive material 16 buried inside the trench T passing through the semiconductor layer 13. Thus the potential distribution can be made gradual also on the second major surface side of the semiconductor layer 13, and electric field concentration can be prevented.

More specifically, also in this embodiment, during switching-off, the electric field from the field plate portion 45b, which has a gradual potential distribution along its path length, can be exerted not only from the first major surface side of the semiconductor layer 13 but also from the second major surface side thereof. For example, even if the first insulating layer 12 is thinned to prevent warpage of the semiconductor substrate 11, the potential of the semiconductor substrate 11 (e.g., ground potential) is prevented from affecting the semiconductor layer 13, and the potential distribution in the semiconductor layer 13 between the high-potential side and the low-potential side is made gradual. Thus electric field concentration can be prevented. Consequently, it can be expected to achieve a breakdown voltage determined by the characteristics inherent to the material (e.g., silicon).

Furthermore, in this embodiment, during switching-on, the electric field of the control electrode portion 45a can be guided around also to the second major surface side of the third semiconductor region 44 (the backside in contact with the first insulating layer 12) through the second conductive material 16 buried inside the trench T passing through the third semiconductor region 44. That is, an effect similar to that of the so-called double gate structure, in which channels are formed on both sides of the third semiconductor region 44, can be achieved without complicated processes, allowing reduction of ON resistance.

Third Embodiment

Figure 4A:
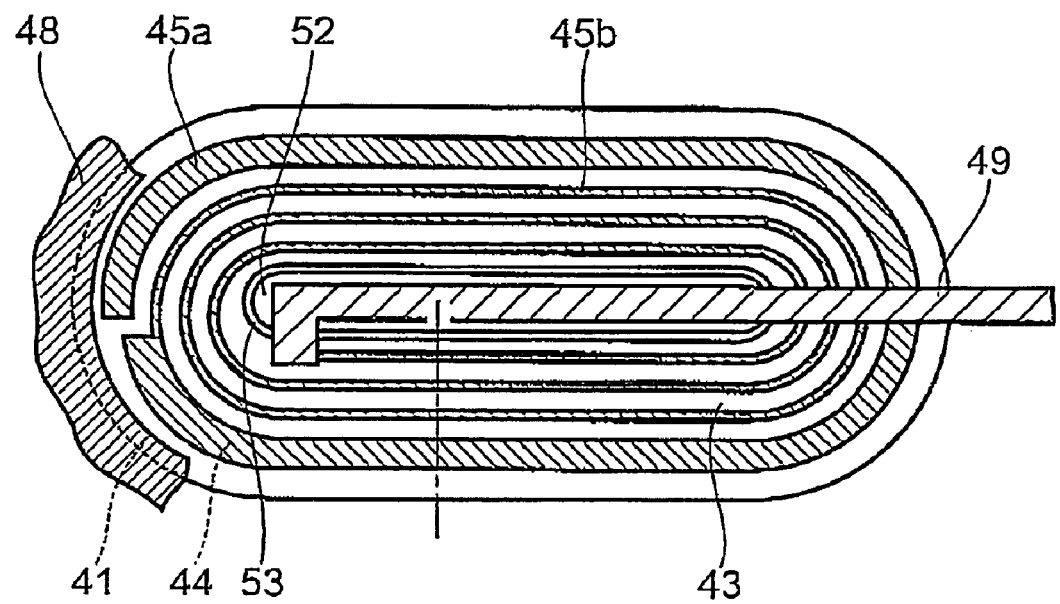
FIG. 4A is a schematic view illustrating the planar structure of the main part of the semiconductor device according to a third embodiment of the invention.
Figure 4B:
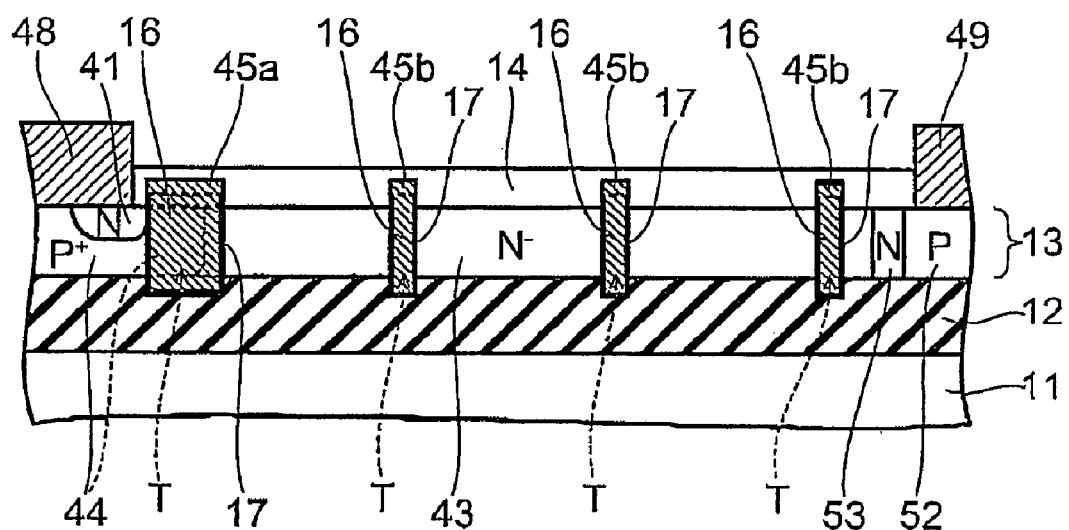
FIG. 4B is a cross-sectional view taken along the line I-I in FIG. 4A.

This embodiment is described with reference to FIG. 4 taking an insulated gate bipolar transistor (IGBT) as an example of the semiconductor device. The same components as those of the above first and second embodiment are marked with like reference numerals, and the detailed description thereof is omitted.

In this embodiment, in a semiconductor layer 13 illustratively made of N⁻-type silicon, a third semiconductor region (base region) 44 illustratively made of P⁺-type silicon is formed in a ring shape, and a buffer region 53 illustratively made of N-type silicon is formed inside and spaced from the third semiconductor region 44. In the surface of the third semiconductor region 44, a first semiconductor region (emitter region) 41 illustratively made of N-type silicon is formed in a ring shape. A drift region 43 illustratively made of N-type silicon is formed in a ring shape between, and in contact with, the third semiconductor region 44 and the buffer region 53. A second semiconductor region (collector region) 52 illustratively made of P-type silicon is formed inside the buffer region 53.

The first semiconductor region 41 is connected to the first main electrode 48, and the second semiconductor region 52 is connected to the second main electrode 49. A field plate portion 45b is provided in the second insulating layer 14 located on the drift region 43, and a control electrode portion 45a is provided in the second insulating layer 14 located on the third semiconductor region 44. The control electrode portion 45a and the field plate portion 45b are concatenated and formed in a spiral shape.

In the semiconductor device (IGBT) according to this embodiment, upon application of a desired control voltage (gate voltage) to the control electrode portion 45a, an n-channel is formed in the third semiconductor region 44 opposed to the control electrode portion 45a across the second insulating layer 14, and the portion between the first main electrode 48 and the second main electrode 49 (between the emitter and the collector) is turned into the ON state. In the IGBT, electrons and holes are injected from the emitter and the collector, respectively, and carriers are accumulated in the drift region 43 to cause conductivity modulation. Thus the ON resistance can be reduced.

Furthermore, also in this embodiment, the electric field of the control electrode portion 45a can be guided around also to the second major surface side of the third semiconductor region 44 (the backside in contact with the first insulating layer 12) through the second conductive material 16 buried inside the trench T passing through the third semiconductor region 44. That is, an effect similar to that of the so-called double gate structure, in which channels are formed on both sides of the third semiconductor region 44, can be achieved without complicated processes, allowing reduction of ON resistance.

Moreover, during switching-off, the electric field from the field plate portion 45b, which has a gradual potential distribution along its path length, can be exerted not only from the first major surface side of the semiconductor layer 13 but also from the second major surface side thereof. The potential of the semiconductor substrate 11 (e.g., ground potential) is prevented from affecting the semiconductor layer 13, and the potential distribution in the semiconductor layer 13 between the high-potential side and the low-potential side is made gradual. Thus electric field concentration can be prevented. Consequently, it can be expected to achieve a breakdown voltage determined by the characteristics inherent to the material (e.g., silicon).

Fourth Embodiment

Figure 5A:
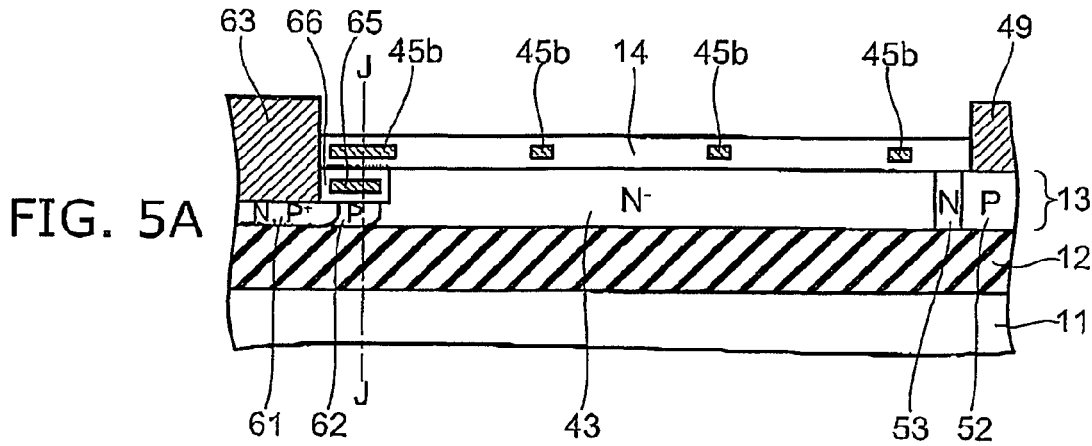
FIG. 5A is a schematic view illustrating the cross-sectional structure of the main part of the semiconductor device according to a fourth embodiment of the invention.

This embodiment is described with reference to FIG. 5 taking an injection enhanced gate transistor (IEGT) as an example of the semiconductor device. The same components as those of the above embodiments are marked with like reference numerals, and the detailed description thereof is omitted.

Figure 5B:
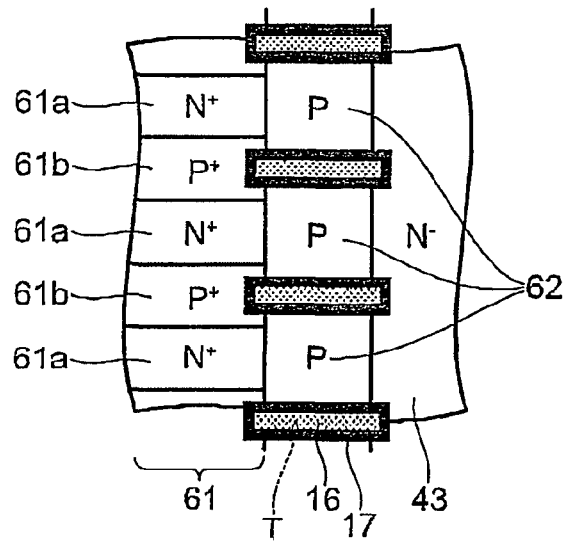
FIG. 5B is a schematic view showing an example planar pattern of the main part in FIG. 5A.

In this embodiment, a third semiconductor region (base region) 62 illustratively made of P-type silicon is formed in a ring shape outside a drift region 43 illustratively made of N⁻-type silicon. The drift region 43 forms a PN junction with the third semiconductor region 62. A semiconductor region 61 is formed in a ring shape outside the third semiconductor region 62. As shown in FIG. 5B, the semiconductor region 61 comprises a first semiconductor region (emitter region) 61*a* illustratively made of N-type silicon and a base contact region 61*b* illustratively made of P⁺-type silicon and formed adjacent to the first semiconductor region 61*a*. A plurality of first semiconductor regions 61*a* and base contact regions 61*b* are alternately repeated in the direction perpendicular to the page in FIG. 5A. The first semiconductor region 61*a* forms a PN junction with the base contact region 61*b*. The first semiconductor region 61*a* forms a PN junction with the third semiconductor region 62.

As shown in FIG. 5B, trenches T and second conductive materials 16 buried therein are provided periodically in the third semiconductor region 62. The trenches T and the second conductive materials 16 are illustratively provided adjacent to the base contact regions 61*b* so as to sandwich the portion adjacent to the first semiconductor region 61*a* (the portion in which a channel is formed). Hence the potential of the second conductive material 16 (gate potential) can be guided around the channel formation portion in two paths, facilitating reduction of ON resistance.

The first semiconductor region 61*a* and the base contact region 61*b* are in contact with a first main electrode 63. The base contact region 61*b* is in contact with the third semiconductor region 62, thereby fixing the potential of the third semiconductor region 62 to the potential of the first main electrode 63 (emitter potential) in the OFF state. Thus the breakdown voltage of the transistor can be improved by preventing the parasite bipolar effect during the OFF state and the switching time.

An insulating layer 66 is provided on the third semiconductor region 62, and a control electrode 65 is provided in the insulating layer 66. The control electrode 65 is opposed to the third semiconductor region 62 across the insulating layer 66.

A second insulating layer 14 is provided on the semiconductor layer 13 and the insulating layer 66, and a field plate portion 45*b* is provided in the second insulating layer 14 located on the drift region 43. One end of the field plate portion 45*b* is provided above the control electrode portion 65 and connected to the control electrode portion 65 or the first main electrode 63. The other end of the field plate portion 45*b* is connected to a second main electrode 49.

In this embodiment, the third semiconductor region (base region) 62 has a smaller thickness than that of the semiconductor device (IGBT) according to the above third embodiment. Thus the inflow of holes injected from the second semiconductor region (collector region) 52 into the third semiconductor region 62 (i.e., outflow to the first main electrode 63 side) decreases, relatively increasing the amount of electron injection. Hence reduction of ON resistance is achieved.

Figure 5C:
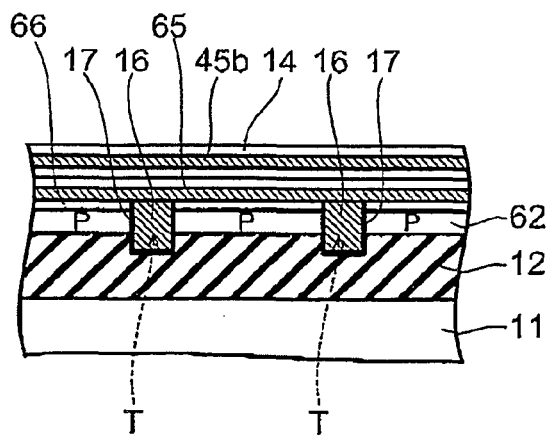
FIG. 5C is a cross-sectional view taken along the line J-J in FIG. 5A.

Furthermore, also in this embodiment, during switching-on, as shown in FIG. 5C, the electric field of the control electrode 65 can be guided around also to the second major surface side of the third semiconductor region 62 (the backside in contact with the first insulating layer 12) through the second conductive material 16 buried inside the trench T passing through the third semiconductor region 62. That is, an effect of the so-called back gate structure, in which channels are formed on both sides of the third semiconductor region 62, can be achieved without complicated processes, allowing reduction of ON resistance.

Moreover, during switching-off, the electric field from the field plate portion 45*b*, which has a gradual potential distribution along its path length, can be exerted not only from the first major surface side of the semiconductor layer 13 but also from the second major surface side thereof. The potential of the semiconductor substrate 11 (e.g., ground potential) is prevented from affecting the semiconductor layer 13, and the potential distribution in the semiconductor layer 13 between the high-potential side and the low-potential side is made gradual. Thus electric field concentration can be prevented. Consequently, it can be expected to achieve a breakdown voltage determined by the characteristics inherent to the material (e.g., silicon).

Fifth Embodiment

Figure 6A:
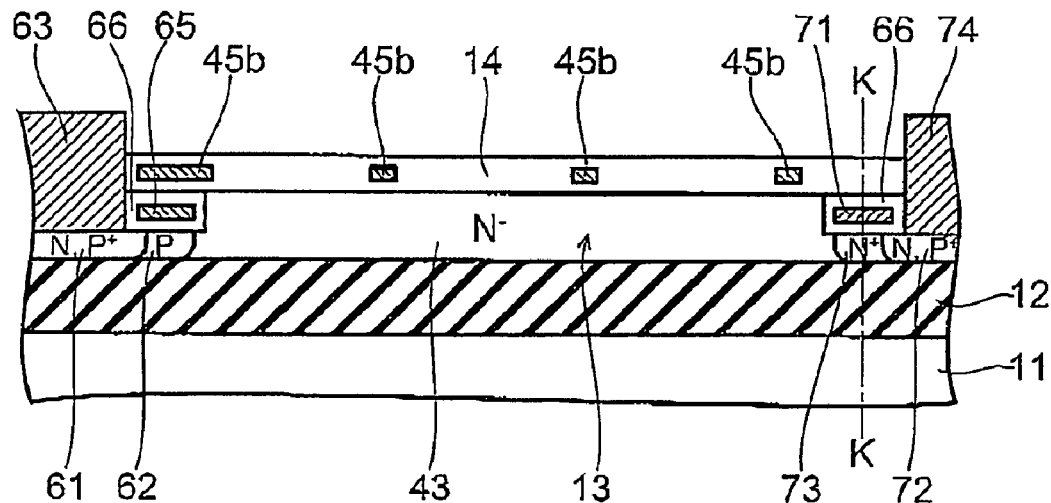
FIG. 6A is a schematic view illustrating the cross-sectional structure of the main part of the semiconductor device according to a fifth embodiment of the invention.

In this embodiment, as shown in FIG. 6, a third semiconductor region (base region) 62 illustratively made of P-type silicon is formed in a ring shape outside a drift region 43 illustratively made of N⁻-type silicon. The drift region 43 forms a PN junction with the third semiconductor region 62. A semiconductor region 61 is formed in a ring shape outside the third semiconductor region 62. Like the above fourth embodiment, as shown in FIG. 5B, the semiconductor region 61 comprises a first semiconductor region (emitter region) 61*a* illustratively made of N-type silicon and a base contact region 61*b* illustratively made of P⁺-type silicon and formed adjacent to the first semiconductor region 61*a*. A plurality of first semiconductor regions 61*a* and base contact regions 61*b* are alternately repeated in the direction perpendicular to the page in FIG. 6A. The first semiconductor region 61*a* forms a PN junction with the base contact region 61*b*. The first semiconductor region 61*a* forms a PN junction with the third semiconductor region 62.

An N-type buffer region 73 illustratively made of N⁺-type silicon is formed outside the drift region 43, and a semiconductor region 72 is formed outside the N-type buffer region 73. Like the semiconductor region 61 shown in FIG. 5B, the semiconductor region 72 comprises a contact region illustratively made of N-type silicon and a second semiconductor region illustratively made of P⁺-type silicon and formed adjacent to the contact region. A plurality of second semiconductor regions and contact regions are alternately repeated in the direction perpendicular to the page in FIG. 6A and form PN junctions with each other. The second semiconductor region and the contact region are in contact with a second main electrode 74.

An insulating layer 66 is provided on the N-type buffer region 73, and a control electrode portion 71 is provided in the insulating layer 66. The control electrode portion 71 is opposed to the N-type buffer region 73 across the insulating layer 66.

Figure 6B:
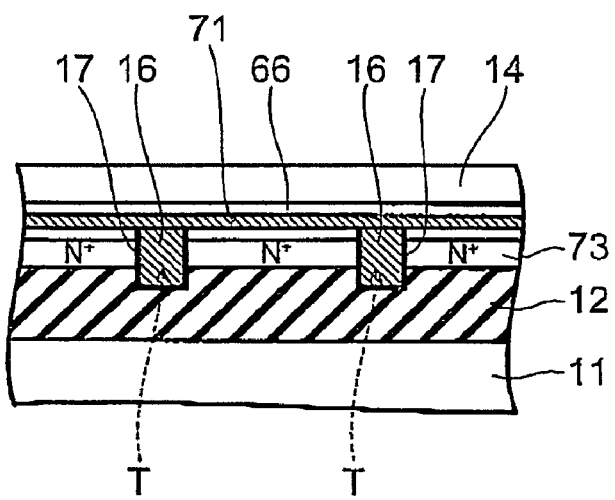
FIG. 6B is a cross-sectional view taken along the line K-K in FIG. 6A.

As shown in FIG. 6B, which is a cross-sectional view taken along line K-K in FIG. 6A, a trench T is formed through the N-type buffer region 73, and a second conductive material 16 connected to the control electrode portion 71 is buried inside the trench T. Thus the electric field of the control electrode portion 71 can be guided around also to the second major surface side of the N-type buffer region 73 (the backside in contact with the first insulating layer 12) through the second conductive material 16. That is, an effect similar to that of the so-called double gate structure, in which channels are formed on both sides of the N-type buffer region 73, can be achieved without complicated processes, allowing reduction of ON resistance.

Furthermore, according to this embodiment, the thickness of the third semiconductor region 62 is decreased to reduce the outflow of holes to the first main electrode 63, and the thickness of the N-type buffer region 73 is decreased to reduce the outflow of holes to the second main electrode 74. This results in increasing the amount of accumulated carriers in the drift region 43, allowing reduction of ON resistance.

Sixth Embodiment

In this embodiment, as shown in FIG. 7, a semiconductor layer 83 thinner than the semiconductor layer 13 of the above embodiments is provided above a semiconductor substrate 11 through the intermediary of a first insulating layer 12.

In the semiconductor layer 83, a drift region 43 illustratively made of N⁻-type silicon is formed in a ring shape. A third semiconductor region (base region) 62 illustratively made of P-type silicon is formed in a ring shape outside the drift region 43. The drift region 43 forms a PN junction with the third semiconductor region 62. A semiconductor region 61 is formed in a ring shape outside the third semiconductor region 62. As shown in FIG. 5B, the semiconductor region 61 comprises a first semiconductor region (emitter region) 61a illustratively made of N-type silicon and a base contact region 61b illustratively made of P⁺-type silicon and formed adjacent to the first semiconductor region 61a. A plurality of first semiconductor regions 61a and base contact regions 61b are alternately repeated in the direction perpendicular to the page in FIG. 7A and form PN junctions with each other.

An N-type buffer region 73 illustratively made of N⁺-type silicon is formed in a ring shape inside the drift region 43. A semiconductor region 72 is formed in a ring shape outside the N-type buffer region 73. Like the semiconductor region 61 shown in FIG. 5B, the semiconductor region 72 comprises a contact region illustratively made of N-type silicon and a second semiconductor region illustratively made of P⁺-type silicon and formed adjacent to the contact region. A plurality of second semiconductor regions and contact regions are alternately repeated in the direction perpendicular to the page in FIG. 7A and form PN junctions with each other.

The first semiconductor region 61a and the base contact region 61b are in contact with a first main electrode 63. The second semiconductor region and the contact region are in contact with a second main electrode 74.

In the second insulating layer 14 provided on the semiconductor layer 83, a field plate portion 45b is provided above the drift region 43, and a control electrode portion 45a is provided above the third semiconductor region 62 and the N-type buffer region 73. One end of the field plate portion 45b is connected to the control electrode portion 45a or the first main electrode 63, and the other end is connected to the second main electrode 74.

Figure 7A:
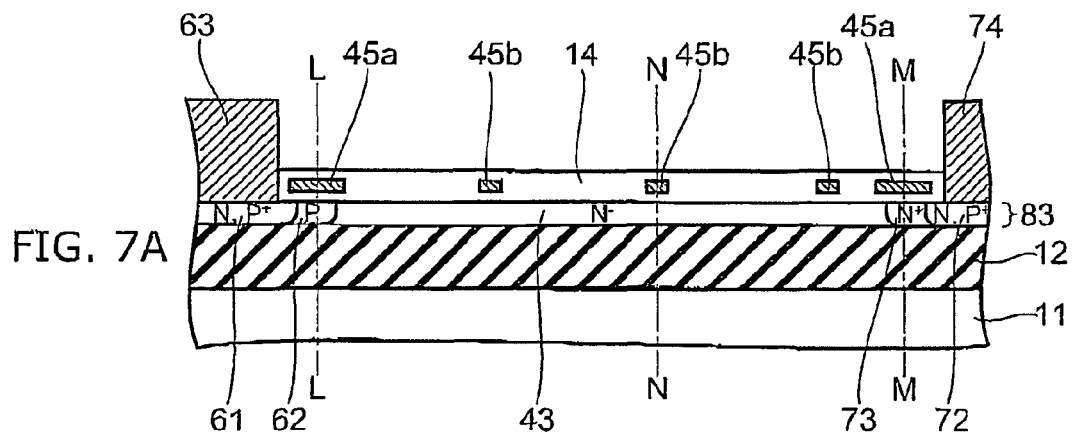
FIG. 7A is a schematic view illustrating the cross-sectional structure of the main part of the semiconductor device according to a sixth embodiment of the invention.
Figure 7B:
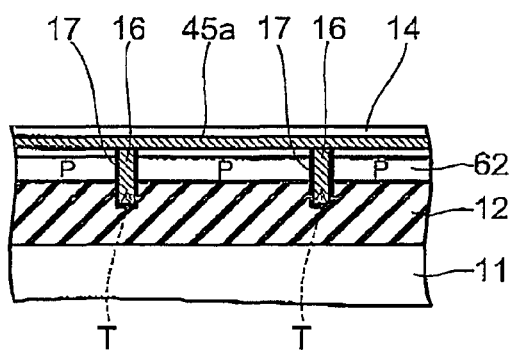
FIG. 7B is a cross-sectional view taken along the line L-L in FIG. 7A.
Figure 7C:
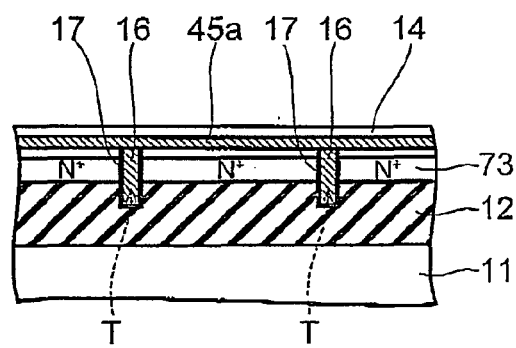
FIG. 7C is a cross-sectional view taken along the line M-M in FIG. 7A.
Figure 7D:
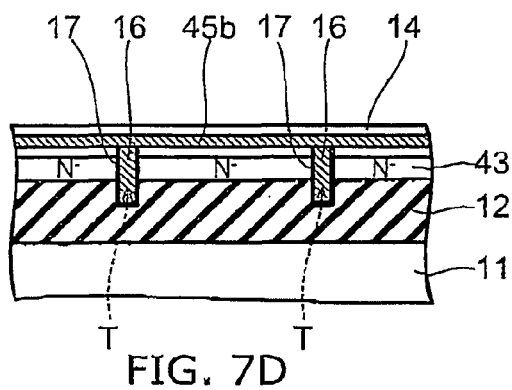
FIG. 7D is a cross-sectional view taken along the line N-N in FIG. 7A.

A plurality of trenches T are selectively formed in the portion of the drift region 43 located below the field plate portion 45b as shown in FIG. 7D. A conductive material 16 is buried in the trench T through the intermediary of an insulating film 17 such as a silicon oxide film.

Furthermore, a plurality of trenches T are selectively formed also in the portion of the third semiconductor region 62 located below the control electrode portion 45a as shown in FIG. 7B. The second conductive material 16 is buried in the trench T through the intermediary of the silicon oxide film 17. Moreover, a plurality of trenches T are selectively formed also in the portion of the N-type buffer region 73 located below the control electrode portion 45a as shown in FIG. 7C. The second conductive material 16 is buried in the trench T through the intermediary of the silicon oxide film 17.

Also in this embodiment, during switching-on, the electric field of the control electrode portion 45a can be guided around also to the second major surface side of the third semiconductor region 62 and the N-type buffer region 73 (the backside in contact with the first insulating layer 12) through the second conductive material 16 buried inside the trench T passing through the third semiconductor region 62 and the N-type buffer region 73. That is, an effect similar to that of the so-called double gate structure, in which channels are formed on both sides of the third semiconductor region 62 and the N-type buffer region 73, can be achieved without complicated processes, allowing reduction of ON resistance.

Moreover, during switching-off, the electric field from the field plate portion 45b, which has a gradual potential distribution along its path length, can be exerted not only from the first major surface side of the semiconductor layer 13 but also from the second major surface side thereof. The potential of the semiconductor substrate 11 (e.g., ground potential) is prevented from affecting the semiconductor layer 13, and the potential distribution in the semiconductor layer 13 between the high-potential side and the low-potential side is made gradual. Thus electric field concentration can be prevented. Consequently, it can be expected to achieve a breakdown voltage determined by the characteristics inherent to the material (e.g., silicon).

Seventh Embodiment

As shown in FIG. 9, the structure of the semiconductor device according to this embodiment is different from the structure of the above embodiment shown in FIG. 3 in that the first conductive material includes only the control electrode portion 45a without including the field plate portion 45b.

Also in this embodiment, the electric field of the control electrode portion 45a can be guided around also to the backside of the third semiconductor region 44 through the second conductive material 16. That is, an effect similar to that of the so-called double gate structure, in which channels are formed on both sides of the third semiconductor region 44, can be achieved without complicated processes, allowing reduction of ON resistance.

Eighth Embodiment

In the semiconductor layer 13 of the structure of the above seventh embodiment, the structure on the source side may be configured as that in the above fourth embodiment.

More specifically, as shown in FIG. 10, a semiconductor region 61 is formed in a ring shape outside the third semiconductor region 44. As shown in FIG. 10E, the semiconductor region 61 comprises a first semiconductor region (emitter region) 61a illustratively made of N⁺-type silicon and a base contact region 61b illustratively made of P⁺-type silicon and formed adjacent to the first semiconductor region 61a. A plurality of first semiconductor regions 61a and base contact regions 61b are alternately repeated in the direction perpendicular to the page in FIG. 10B. The first semiconductor region 61a forms a PN junction with the base contact region 61b. The first semiconductor region 61a forms a PN junction with the third semiconductor region 44.

As shown in FIG. 10E, trenches T and second conductive materials 16 buried therein are provided periodically in the third semiconductor region 44. The trenches T and the second conductive materials 16 are illustratively provided adjacent to the base contact regions 61*b* so as to sandwich the portion adjacent to the first semiconductor region 61*a* (the portion in which a channel is formed). Hence the potential of the second conductive material 16 (gate potential) can be guided around the channel formation portion in two paths, facilitating reduction of ON resistance.

The first semiconductor region 61*a* and the base contact region 61*b* are in contact with a first main electrode 48. The base contact region 61*b* is in contact with the third semiconductor region 44, thereby fixing the potential of the third semiconductor region 44 to the potential of the first main electrode 48 (emitter potential) in the OFF state. Thus the breakdown voltage of the transistor can be improved by preventing the parasite bipolar effect during the OFF state and the switching time.

Ninth Embodiment

Figure 11A:
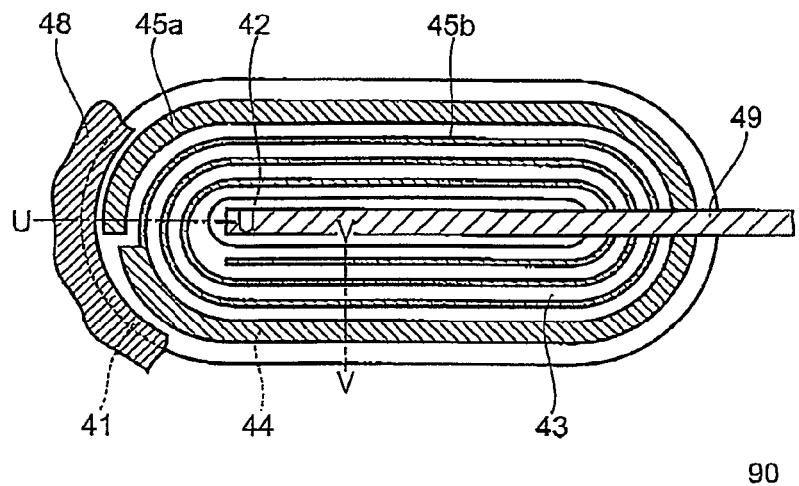
FIG. 11A is a schematic view illustrating the planar structure of the main part of the semiconductor device according to a ninth embodiment of the invention.
Figure 11B:
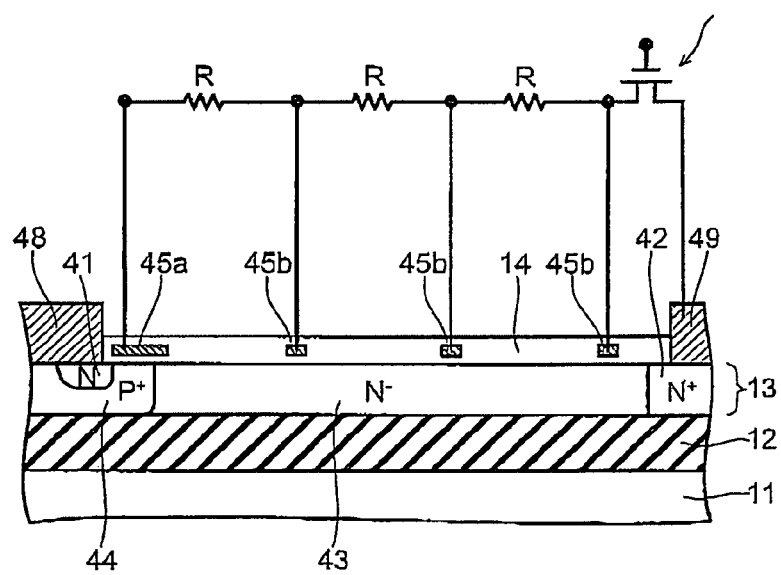
FIG. 11B is a cross-sectional view taken along the line U-U in FIG. 11A.
Figure 11C:
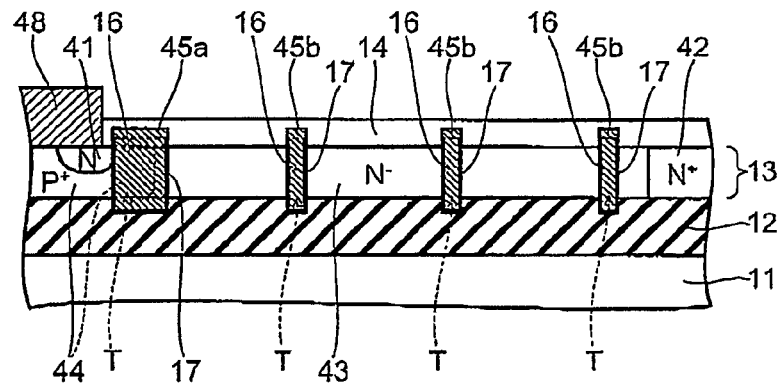
FIG. 11C is a cross-sectional view taken along the line V-V in FIG. 11A.

In this embodiment, as shown in FIG. 11B, the field plate portion 45*b* in the structure of the above embodiment shown in FIG. 3 is connected to the second main electrode (drain electrode) 49 through a switch (transistor) 90. In FIG. 11B, R represents the resistive component of the field plate portion 45*b* constituting the first conductive material and the resistive component between the field plate portion 45*b* and the control electrode portion 45*a*.

The switch 90 is turned off in the device conduction state, preventing short circuit between the second main electrode 49 and the control electrode portion 45*a*. Furthermore, because the same potential as that of the control electrode portion 45*a* is applied to the field plate portion 45*b* through the resistance R, the same MOS channel (or accumulation of carriers) as that near the control electrode portion 45*a* is formed also near the field plate portion 45*b* of the drift layer 43, reducing the device ON resistance. In the device OFF state, the switch 90 is turned on, and the potential of the field plate portion 45*b* has a gradual distribution as described in the above embodiments. Thus the breakdown voltage can be improved by preventing electric field concentration in the semiconductor layer 13.

Figure 12:
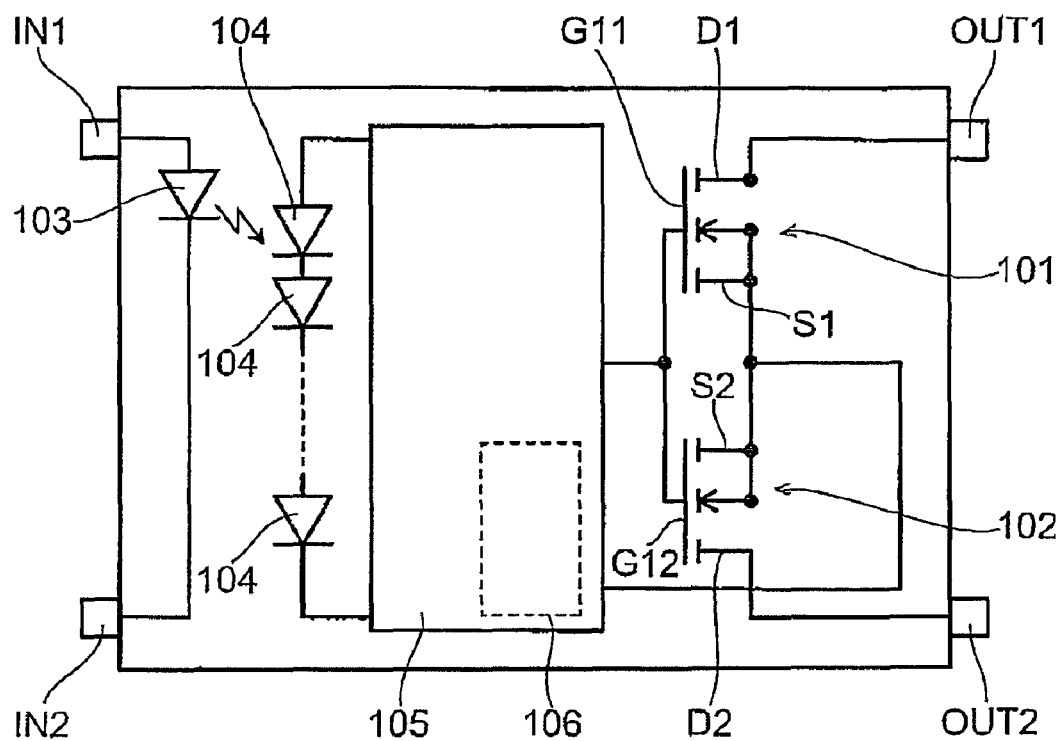
FIG. 12 is circuit diagram of photorelay using the semiconductor device according to the embodiment of the invention.

The semiconductor devices according to the above embodiments can be used as switches 101, 102 of a photorelay illustrated in FIG. 12.

Between input terminals IN1 and IN2 for receiving a switching control signal is connected a light emitting device (light emitting diode) 103 for emitting light in response to the switching control signal. The photorelay includes a photodiode array 104 (composed of a plurality of series-connected photodiodes) for producing a DC voltage upon receiving the light emitted by the light emitting device 103. The DC voltage outputted from the photodiode array 104 is supplied to the gate G11, G12 of the switch 101, 102 through a control circuit 105. The drain D1 of the switch 101 is connected to an output terminal OUT1, and the drain D2 of the switch 102 is connected to an output terminal OUT2.

When a control voltage from the control circuit 105 is applied to the gate G11, G12 of the switch 101, 102, the switches 101, 102 are turned on, and thereby the path between the output terminals OUT1 and OUT2 is turned into the conducting state. When the switching control signal inputted to the input terminals IN1, IN2 vanishes, the light emitting device 103 stops light emission, and thereby the DC voltage produced between the terminals of the photodiode array 104 also vanishes. Thus the switches 101, 102 are turned off.

The control circuit 105 includes a discharge circuit 106 connected between the gate G11, G12 and the source S1, S2 of the switches 101, 102. The discharge circuit 106 serves to rapidly discharge charges accumulated between the gate and the source when the switches 101, 102 are switched from the ON state into the OFF state.

The semiconductor substrate 11 and the semiconductor layer 13, 83 in the above embodiments may be made of gallium nitride, silicon carbide, or other compound semiconductors, or germanium, besides silicon.

Figure 8:
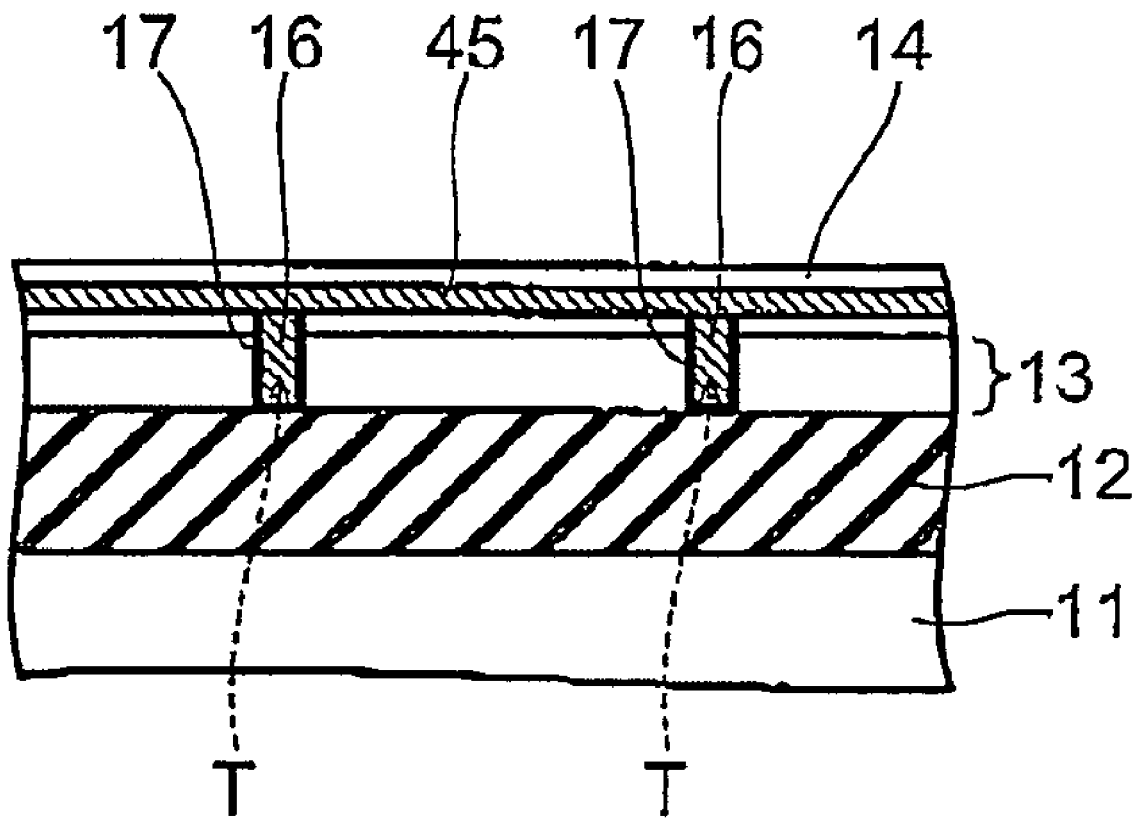
FIG. 8 is a schematic cross-sectional view showing a variation of the semiconductor device according to the embodiment.
Figure 9A:
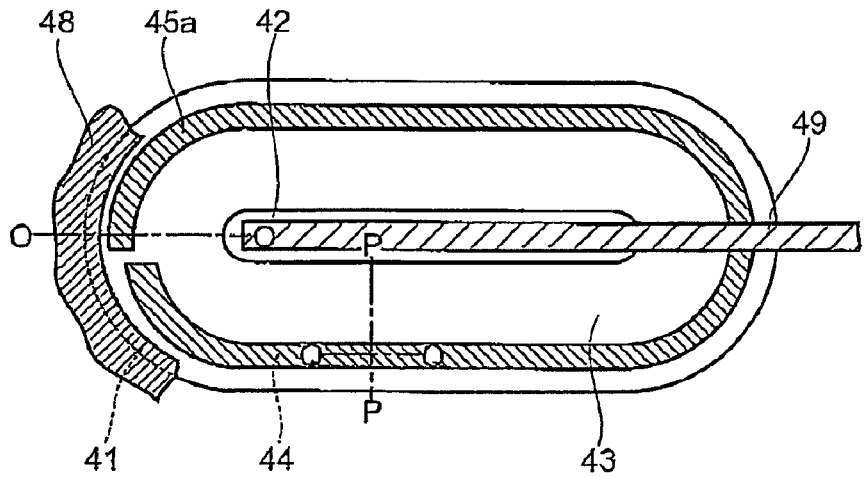
FIG. 9A is a schematic view illustrating the planar structure of the main part of the semiconductor device according to a seventh embodiment of the invention.
Figure 9B:
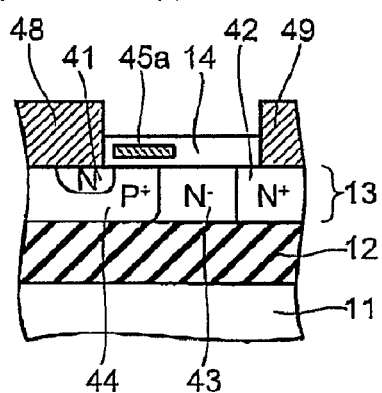
FIG. 9B is a cross-sectional view taken along the line O-O in FIG. 9A.
Figure 9C:
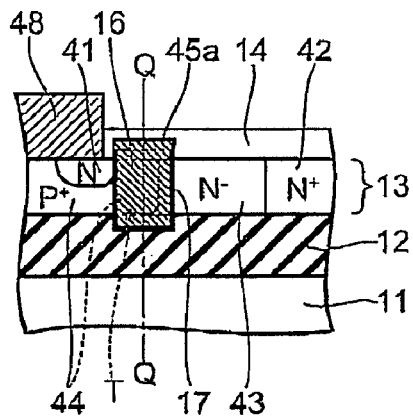
FIG. 9C is a cross-sectional view taken along the line P-P in FIG. 9A.
Figure 9D:
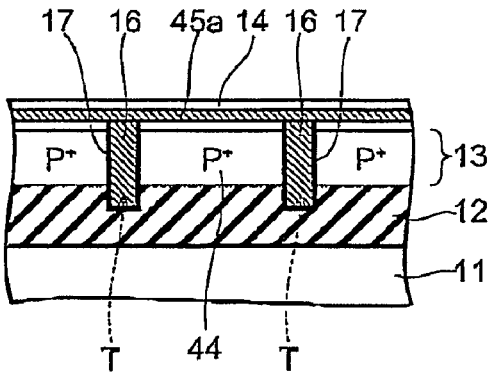
FIG. 9D is a cross-sectional view taken along the line Q-Q in FIGS. 9A and 9C.
Figure 13:
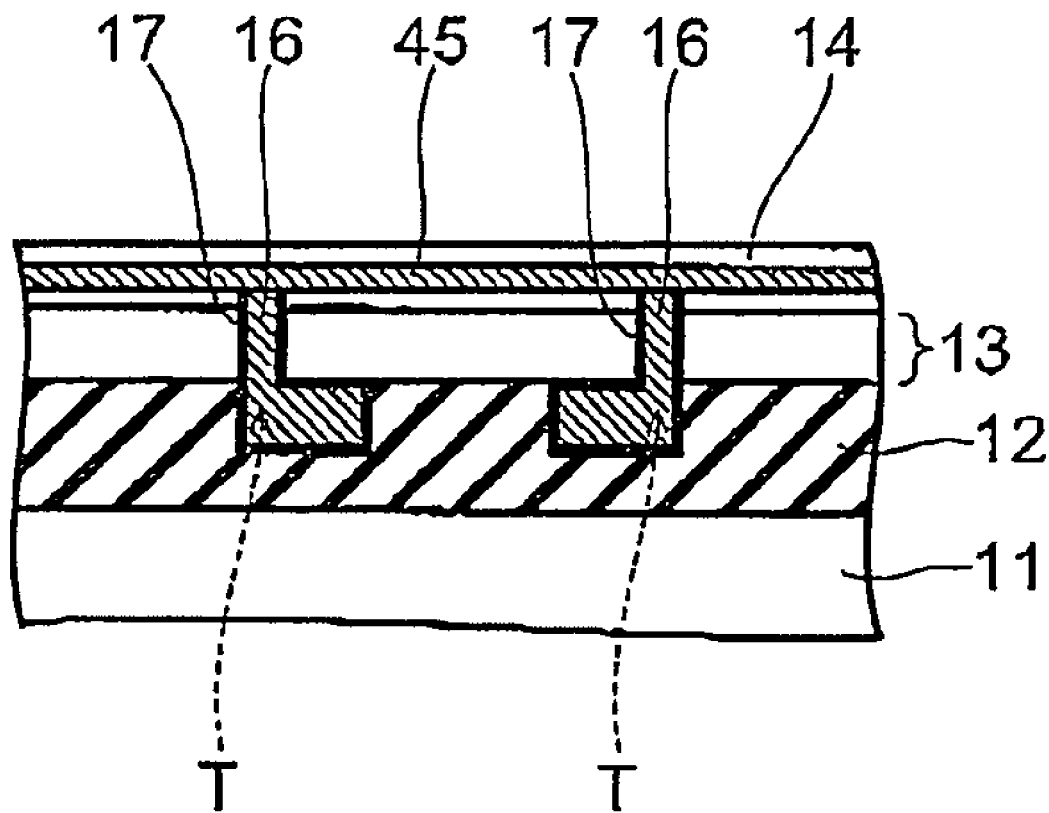
FIG. 13 is a schematic cross-sectional view showing a variation of the semiconductor device according to the embodiment of the invention.

The second conductive material 16 buried in the trench T that is formed through the drift layer below the field plate portion may not extend into the first insulating layer 12. As shown in FIG. 8, the trench T may be limited to extending to the surface of the first insulating layer 12 through the semiconductor layer 13, or the bottom of the trench T may be limited to extending into the semiconductor layer 13 slightly above the first insulating layer 12. An insulating film 17 illustratively made of silicon oxide may be formed on the inner wall surface (side surface and bottom surface) of the trench T, and the second conductive material 16 may be buried therein. Also in this case, the electric field of the field plate portion opposed to the frontside of the semiconductor layer 13 can be guided around to the backside of the semiconductor layer 13. However, the above effect of the electric field on the backside of the semiconductor layer 13 is enhanced when the second conductive material 16 extends into the first insulating layer 12. Alternatively, as shown in FIG. 13, the bottom of the trench T and the second conductive material 16 may be configured to protrude slightly in the lateral direction generally parallel to the major surface of the first insulating layer 12 or the semiconductor layer 13. In this case, the above effect of the electric field on the backside of the semiconductor layer 13 is further enhanced.

Preferably, a plurality of trenches and second conductive materials buried therein are provided at a prescribed spacing from the viewpoint of achieving a gradual potential distribution in the semiconductor layer. The plurality of trenches and second conductive materials are preferably connected to each other through the resistive, first conductive material.

The control electrode portion, the field plate portion, the first conductive material, the first main electrode, the second main electrode, and the second conductive material may be made of the same material, or of different materials.

Tenth Embodiment

This embodiment is described with reference to FIG. 14 taking a diode as an example of the semiconductor device.

The semiconductor device according to this embodiment has an SOI (silicon on insulator) in which a semiconductor layer 27 is provided through an insulating layer 26 on a semiconductor substrate 25. As the semiconductor substrate 25 and the semiconductor layer 27, for example, silicon can be used. The insulating layer 26 is, for example, silicon oxide buried and formed on the semiconductor substrate 25.

Figure 14A:
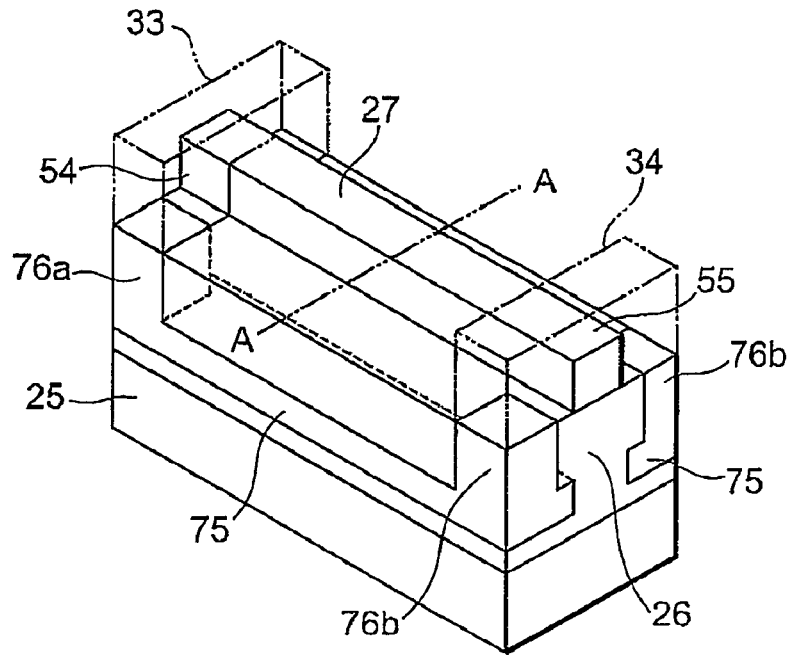
FIG. 14A is a schematic view illustrating the structure of the main part of the semiconductor device according to a tenth embodiment of the invention.
Figure 14B:
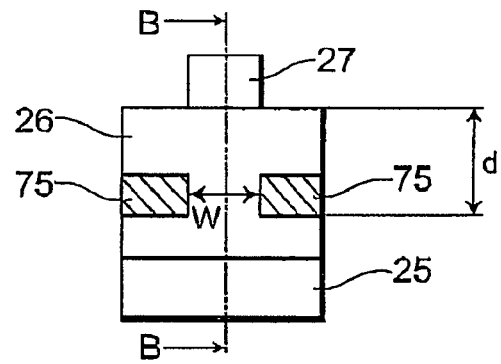
FIG. 14B is a cross-sectional view taken along the line A-A in FIG. 14A.

The semiconductor layer 27 is formed in a shape of pillar, fin, or thin line, on the insulating layer 26. FIG. 14 shows a portion provided with one semiconductor layer 27, but as shown in the schematic plan view of FIG. 15, a plurality of the semiconductor layers 27 are provided in a stripe shape on the insulating layer 26. FIG. 14B shows a cross section of A-A in FIG. 14A, and FIG. 14C shows a cross section of B-B in FIG. 14B.

Figure 14C:
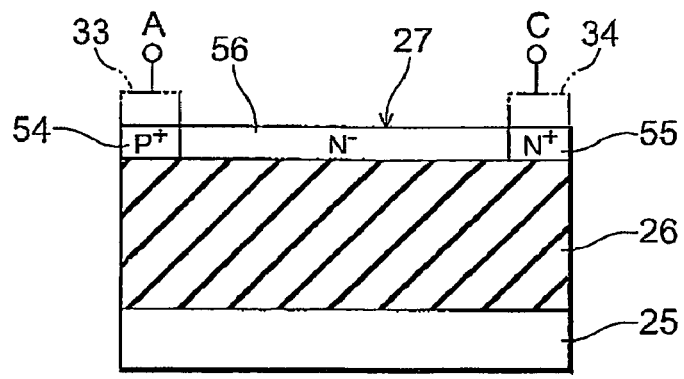
FIG. 14C is a cross-sectional view taken along the line B-B in FIG. 14C.
Figure 15:
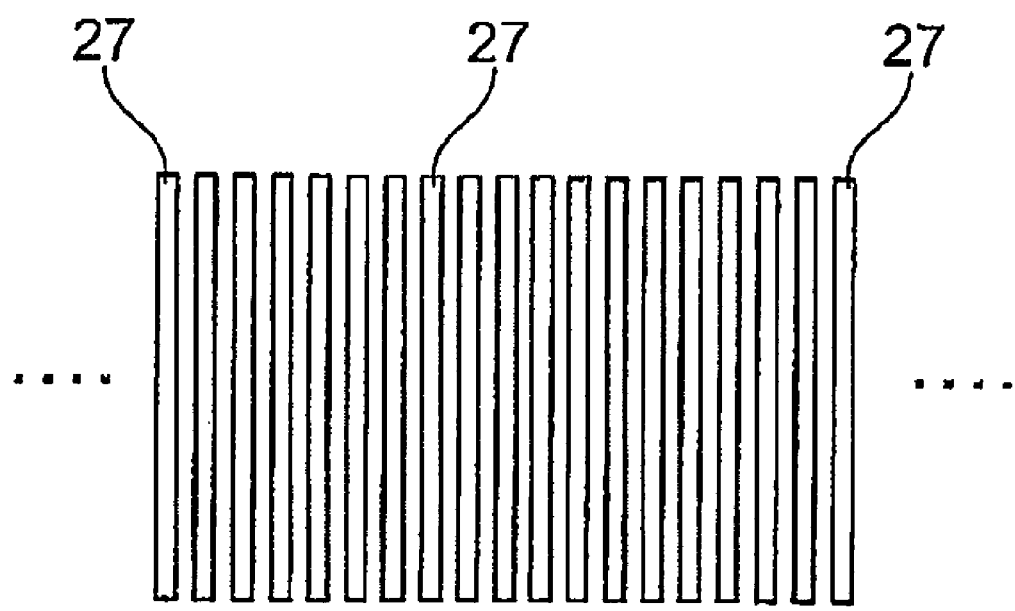
FIG. 15 is a schematic view illustrating a planar pattern of a plurality of semiconductor layers.

As shown in FIG. 14C, in the semiconductor layer 27, a $P^+$-type first semiconductor region 54, an $N^+$-type second semiconductor region 55, and an $N^-$-type drift region 56 are formed. The first semiconductor region 54 and the second semiconductor region 55 are selectively formed at both ends in the longitudinal direction, and the drift region 56 is formed between the first semiconductor region 54 and the second semiconductor region 55. The first semiconductor region 54 and the drift region 56 form a PN junction.

On the insulating layer 26, the first main electrode 33 is provided so as to surround the first semiconductor region 54. In the same manner, on the insulating layer 26, the second main electrode 34 is provided so as to surround the second semiconductor region 55. The first main electrode 33 is in contact with an upper surface and side surfaces of the first semiconductor region 54. The second main electrode 34 is in contact with an upper surface and side surfaces of the second semiconductor region 55.

Upon application of a forward voltage between the first main electrode 33 and the second main electrode 34, a current flows between these electrodes 33 and 34 through the first semiconductor region 54, the drift region 56, and the second semiconductor region 55. That is, the semiconductor device according to this embodiment is also a so-called lateral semiconductor device in which a current flows in the direction generally parallel to the major surface of the semiconductor substrate 25.

Conductive materials 75 are buried in the insulating layer 26. A conductive material 75 is provided in a portion in the insulating layer 26 over which a semiconductor layer 27 is not provided and which is not opposed to a semiconductor layer 27, namely, in the insulating layer 26 that is a portion between the semiconductor layers 27 with a stripe shape. The conductive material 75 extends in the direction generally parallel to the longitudinal direction of the semiconductor layers 27 and is buried in the insulating layer 26. For every one of the semiconductor layers 27, one pair of the conductive materials 75 is provided in the positional relation of sandwiching the semiconductor layer 27 from the both sides of the lateral direction thereof.

The both ends of the longitudinal direction of a conductive material 75 are connected to connective portions 76a, 76b, respectively. The connective portions 76a, 76b are formed in the insulating layer 26 in a pillar shape of extending onto the surface of the insulating layer 26 from the both ends of the conductive material 75. The surfaces of the upper ends of the connective portions 76a, 76b are exposed onto the surface of the insulating layer 26, and the first main electrode 33 and the second main electrode 34 are in contact with the exposed portions, respectively.

The conductive material 75 can be formed in the insulating layer 26, for example, by a method shown in FIG. 16.

Figure 16A:
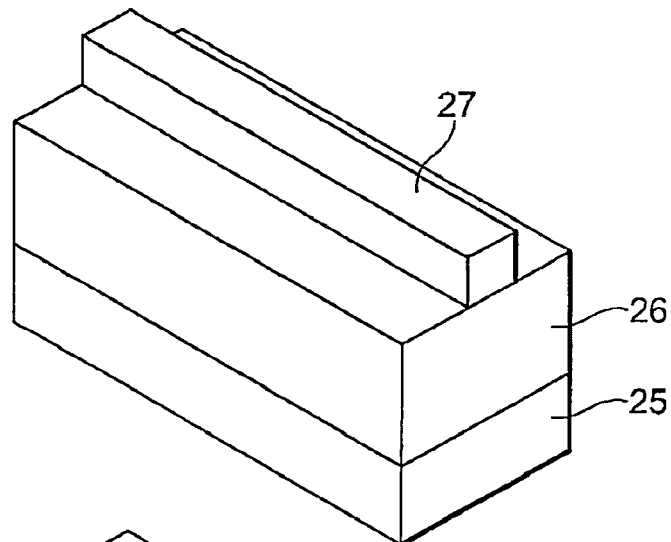
FIGS. 16A, 16B and 16C are process views illustrating the main part of a process for manufacturing the semiconductor device according to the tenth embodiment.

FIG. 16A shows a state in which the insulating layer 26 is formed on the semiconductor substrate 25 and, on the insulating layer 26, the semiconductor layer 27 is formed. As described above with reference to FIG. 15, the semiconductor layers 27 are formed in a stripe shape on the insulating layers 26.

Figure 16B:
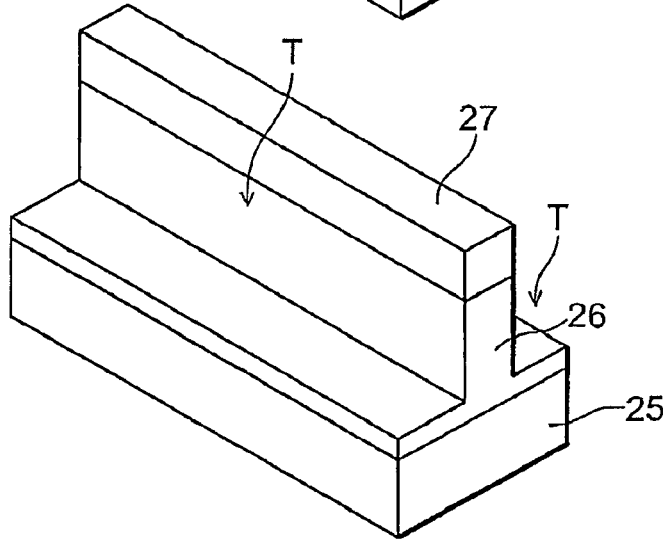

After the structure of FIG. 16A is obtained, masks, which are not shown, are formed on the semiconductor layers 27 and the insulating layer 26 is etched, and trenches T are formed in the insulating layer 26 as shown in FIG. 16B. The portions of the insulating layer 26 under the semiconductor layer 27 are not etched, and the lateral portions thereof are etched. The bottom portions of the trenches T do not reach the semiconductor substrate 25, and some of the insulating layer 26 is left between the trench T and the semiconductor substrate 25.

Figure 16C:
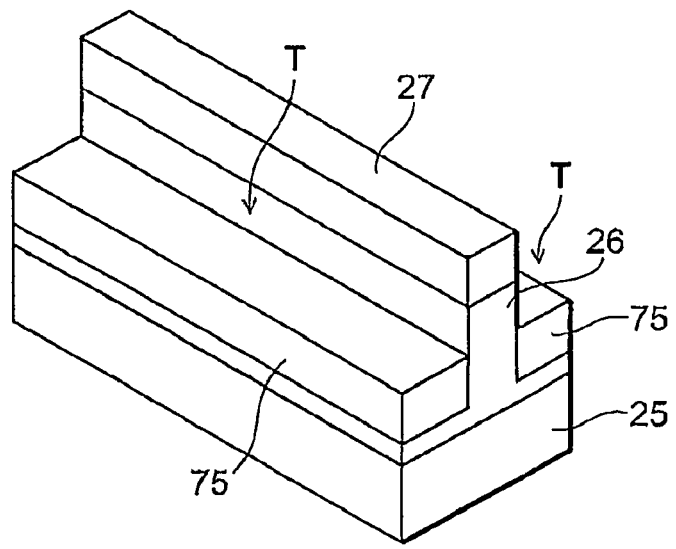

Then, conductive materials 75 are buried in the trenches T. The conductive materials 75 are buried in all of the trenches T, and then, etched back, and, as shown in FIG. 16C, only portions of the bottom sides of the trenches T are left.

Then, the insides of the trenches T on the conductive materials 75 are buried with insulating layers, and then in portions of the insulator layers (which are places where the connective portions 76a, 76b shown in FIG. 14A are formed), trenches reaching the conductive materials 75 from the surface side of the insulating layer is formed, and in the trenches, the same material as the conductive material 75 or a material of lower resistance than that of the conductive material 75 is buried. Thereby, the connective portions 76a each connecting one end of a conductive material 75 with the first main electrode 33 and the connective portions 76b each connecting the other end of the conductive material 75 with the second electrode are formed.

As a material for the conductive materials 75, a material such as polycrystalline silicon or semi-insulated polycrystalline silicon (SIPOS), which is more resistive than the metal material, for example, used for the first main electrode 33 and the second main electrode 34. As a material for the connective portions 76a, 76b, the same material as the conductive material 75 or a material of lower resistance than that of the conductive material 75 is used.

One end of a conductive material 75 is connected to the first main electrode 33 through the connective portion 76a, and the other end of the conductive material 75 is connected to the second main electrode 34 through the connective portion 76b. However, because the conductive material 75 is formed from a material of relatively high resistance, leak current between the first main electrode 33 and the second main electrode 34 can be reduced to a practically negligible level.

The both ends of the longitudinal direction of the conductive material 75 are connected to the first main electrode 33 and the second main electrode 34, respectively. Hence, during switching-off in which a reverse bias is applied between the first main electrode 33 and the second main electrode 34, one end of the conductive material 75 is placed generally at the same potential as the first main electrode 33 to be in the side of lower potential during the reverse bias or at a potential near thereto, and the other end is placed generally at the same potential as the second main electrode 34 to be in the side of higher potential during the reverse bias or at a potential near thereto, and the portion of the conductive material 75 other than its both ends is placed at a potential corresponding to the path length from the ends. That is, in the conductive material 75, a gradual potential distribution in the longitudinal direction connecting the first main electrode 33 with the second main electrode 34 can be obtained.

The conductive material 75 is buried in the insulating layer 26. Therefore, the electric field from the conductive material 75 during switching-off in which a reverse bias is applied is made to act on the side of the back surface of the semiconductor layer 27 (the surface of the semiconductor layer 27 in contact with the insulating layer 26) and thereby the potential in the side of the back surface of the semiconductor layer 27 during switching-off can be controlled.

The conductive material 75 extends in the longitudinal direction connecting the high potential side and the low potential side in the semiconductor layer 27, and in the conductive material 75, a gradual potential distribution is generated in the longitudinal direction as described above. Hence, a depletion layer can be made to extend in the longitudinal direction in the back surface side of the semiconductor layer 27 during switching-off, and a high breakdown voltage can be obtained by suppressing local concentration of the electric field.

In general, in an SOI structure, the potential in the front surface side of the semiconductor layer can be easily controlled by providing a field plate electrode through an insulating layer on the semiconductor layer. On the other hand, because the back surface side of the semiconductor layer is affected by the substrate potential (such as ground potential), the control of the back surface potential is difficult. If the thickness of the insulating layer provided between the substrate and the semiconductor layer is set to be thicker, the effect of the substrate potential on the back surface side of the semiconductor layer can be suppressed, but warpage becomes easy to be generated as the thickness of the insulating layer is thicker. Moreover, it can be thought to control the potential of the back surface side of the semiconductor layer by providing a field plate electrode in the insulating layer that is apportion opposed to the back surface of the semiconductor layer, but in this case, the extraction structure for connecting the field plate electrode to another electrode becomes complex, and also the process for obtaining the structure becomes difficult.

By contrast, in this embodiment, the conductive materials 75 can be buried in the insulating layer 26 by a simple process of forming trenches in the portions of the insulating layer 26 lateral to the semiconductor layers 27, in which the semiconductor layer 27 is not provided, and then burying the conductive materials 75 thereinto. And, the electric field from the conductive material 75 can be made to come round to and act on the back surface side of the semiconductor layer 27. In particular, in a semiconductor layer 27 of a shape of thin line whose width of the lateral direction is fine, the distance between one pair of the conductive materials 75 buried in the positional relation of sandwiching the semiconductor layer 27 from the lateral direction becomes small, and therefore, even when a conductive material does not exist in the position opposed to the back surface of the semiconductor layer 27, the electric field from the conductive material 75 buried laterally to the semiconductor layer 27 can be easily made to act on the entire back surface of the semiconductor layer 27.

By controlling the potential in the back surface sides of the semiconductor layers 27 through the conductive materials 75 buried in the insulating layer 26, the effect of the potential of the semiconductor substrate 25 on the semiconductor layer 27 can be suppressed. Thereby, thinning of the insulating layer 26 can be achieved, and warpage can be prevented.

Eleventh Embodiment

Figure 17:
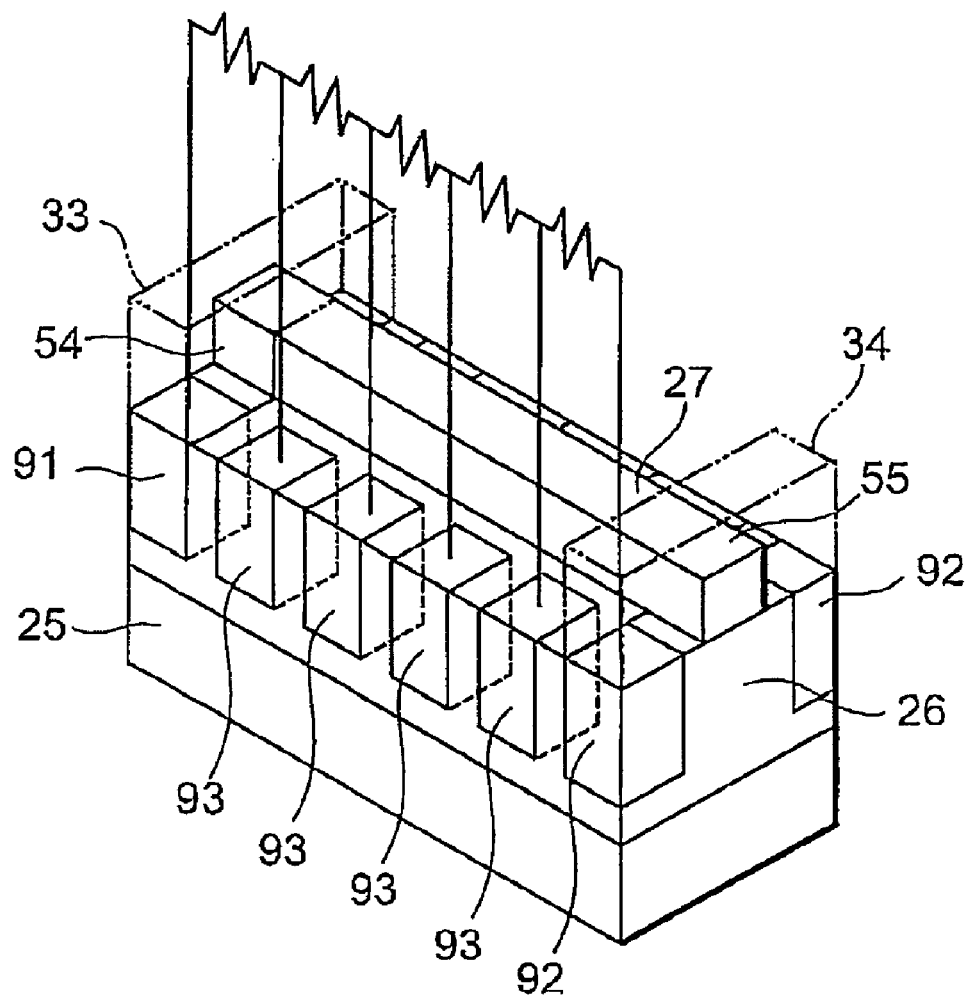
FIG. 17 is a schematic view illustrating the structure of the main part of the semiconductor device according to an eleventh embodiment of the invention.

FIG. 17 is a schematic view showing a substantial structure in the semiconductor device according to the eleventh embodiment of the invention. The semiconductor device according to this embodiment is the same diode as the above-described tenth embodiment, and the same signs are appended to the common parts to those of the semiconductor device according to the tenth embodiment.

Also, conductive materials 91, 92, 93 are provided in portions of the insulating layer 26 over which the semiconductor layer 27 is not provided and which is not opposed to the semiconductor layer 27, namely, in the insulating layer 26 that is a portion between the semiconductor layers 27 with a stripe shape.

The respective conductive materials 91, 92, 93 are provided in a pillar shape of extending from the inside of the insulating layer 26 onto the surface of the insulating layer 26.

The conductive material 91 is buried in the insulating layer 26 lateral to the first semiconductor region 54. The upper end surface of the conductive material 91 is exposed onto the surface of the insulating layer 26, and the first main electrode 33 is in contact with the exposed portion.

The conductive material 92 is buried in the insulating layer 26 lateral to the first semiconductor region 55. The upper end surface of the conductive material 92 is exposed onto the surface of the insulating layer 26, and the second main electrode 34 is in contact with the exposed portion.

In the insulating layer 26 between the conductive material 91 and the conductive material 92, a plurality of conductive materials 93 are provided side by side in the longitudinal direction of the semiconductor layer 27. The respective conductive materials 91, 92, 93 are not linked to one another inside the insulating layer 26 but are connected to one another through resistant material (such as polycrystalline silicon and semi-insulated polycrystalline silicon (SIPOS)) that are provided on the surface of the insulating layer 26.

During switching-off in which a reverse bias is applied between the first main electrode 33 and the second main electrode 34, the conductive material 91 is placed generally at the same potential as the first main electrode 33 to be in the side of lower potential during the reverse bias or at a potential near thereto, the conductive material 92 is placed generally at the same potential as the second main electrode 34 to be in the side of higher potential during the reverse bias or at a potential near thereto, and the conductive materials 93 between the conductive material 91 and the conductive material 92 are placed at a potential corresponding to the path length from the ends. That is, in the conductive materials 91-93, a gradual potential distribution in the longitudinal direction connecting the first main electrode 33 with the second main electrode 34 can be obtained.

The conductive materials 91-93 are buried in the insulating layer 26. Therefore, also in this embodiment, the electric field from the conductive materials 91-93 during switching-off in which a reverse bias is applied is made to act on the side of the back surface of the semiconductor layer 27, and thereby, a depletion layer can be made to extend in the longitudinal direction in the back surface side of the semiconductor layer 27 during switching-off, and a high breakdown voltage can be obtained by suppressing local concentration of the electric field.

That is, also in this embodiment, the conductive materials 91-93 can be buried in the insulating layer 26 by a simple process of forming trenches in the portions of the insulating layer 26 lateral to the semiconductor layers 27, in which the semiconductor layer 27 is not provided, and then burying the conductive materials 91-93 thereinto. And, the electric field from the conductive materials 91-93 can be made to come round to and act on the back surface side of the semiconductor layer 27.

By controlling the potential in the back surface sides of the semiconductor layers 27 through the conductive materials 91-93 buried in the insulating layer 26, the effect of the potential of the semiconductor substrate 25 on the semiconductor layer 27 can be suppressed. Thereby, thinning of the insulating layer 26 can be achieved, and warpage can be prevented.

Twelfth Embodiment

This embodiment is described with reference to FIG. 18 taking a MOSFET as an example of the semiconductor device.

The semiconductor device according to this embodiment has an SOI (silicon on insulator) in which a semiconductor layer 27 is provided through an insulating layer 26 on a semiconductor substrate 25. As the semiconductor substrate 25 and the semiconductor layer 27, for example, silicon can be used. The insulating layer 26 is, for example, silicon oxide buried and formed on the semiconductor substrate 25.

Figure 18A:
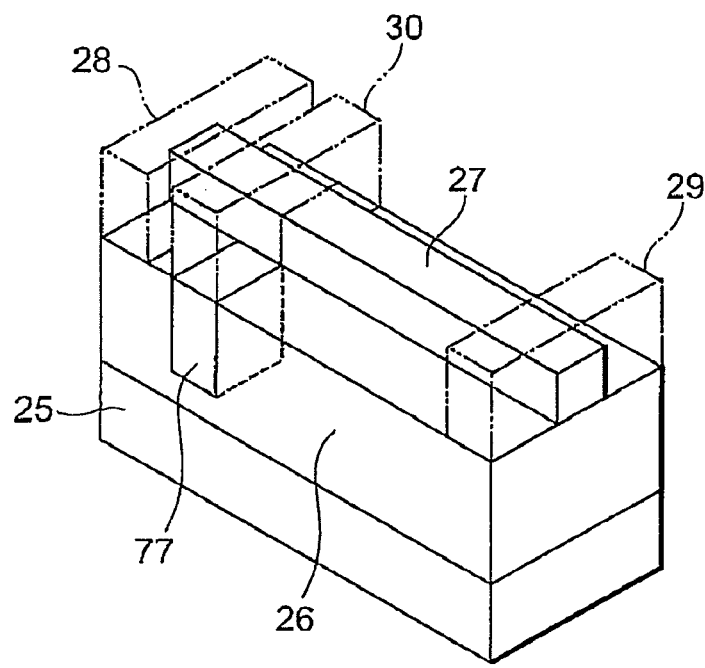
FIG. 18A is a schematic view illustrating the structure of the main part of the semiconductor device according to a twelfth embodiment of the invention.
Figure 18B:
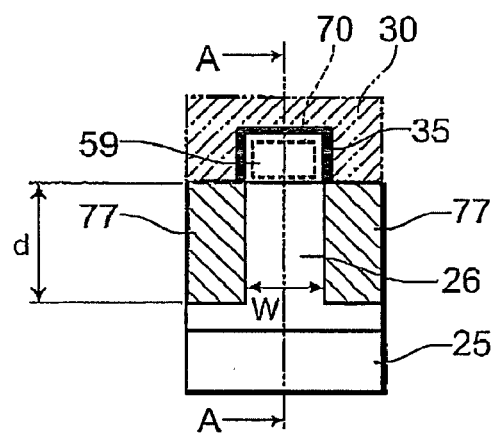
FIG. 18B is a cross-sectional view illustrating a portion in which a control electrode is provided in FIG. 18A.

The semiconductor layer 27 is formed in a shape of pillar, fin, or thin line, on the insulating layer 26. FIG. 18 shows a portion provided with one semiconductor layer 27, but as shown in the schematic plan view of FIG. 15, a plurality of the semiconductor layers 27 are provided in a stripe shape on the insulating layer 26. FIG. 18B shows a cross section of a portion in which a control electrode 30 is provided in FIG. 18A, and FIG. 18C shows a cross section of A-A in FIG. 18B.

Figure 18C:
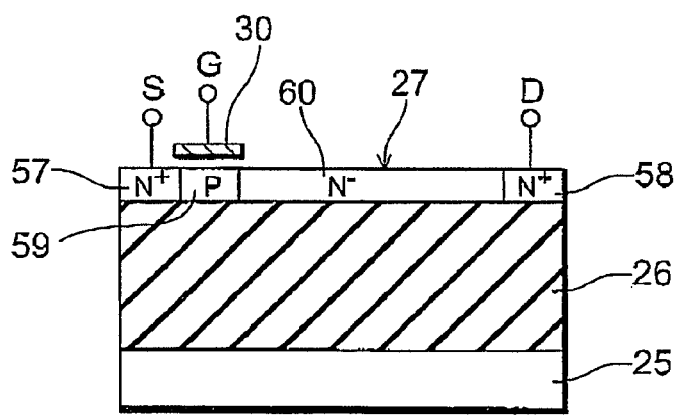
FIG. 18C is a cross-sectional view taken along the line A-A in FIG. 18B.

As shown in FIG. 18C, in the semiconductor layer 27, an $N^+$-type first semiconductor region 57, an $N^+$-type second semiconductor region 58, a P-type third semiconductor region 59, and an $N^-$-type drift region 60 are formed. The first semiconductor region 57 is formed in one end of the longitudinal direction of the semiconductor layer 27, and the second semiconductor region 58 is formed in the other end of the longitudinal direction of the semiconductor layer 27. The first semiconductor region 57 and the third semiconductor region form a PN junction. The drift region 60 is formed between the third semiconductor region 59 and the second semiconductor region 58, and forms a PN junction with respect to the third semiconductor region 59.

On the insulating layer 26, the first main electrode 28 is provided so as to surround the first semiconductor region 57. In the same manner, on the insulating layer 26, the second main electrode 29 is provided so as to surround the second semiconductor region 58. The first main electrode 28 is in contact with an upper surface and side surfaces of the first semiconductor region 57. The second main electrode 29 is in contact with an upper surface and side surfaces of the second semiconductor region 58. Moreover, although not shown, the third semiconductor region 59 is connected to the first main electrode 57.

Furthermore, the control electrode 30 is provided so as to surround the third semiconductor region 59. As shown in FIG. 18B, the control electrode 30 is opposed to the upper surface and the side surfaces of the third semiconductor region 59 through a gate insulator film (such as silicon oxide film).

In this embodiment, when a desired control voltage is applied to the control electrode 30 in a state in which a voltage with a higher potential in the side of the second main electrode 29 than that of the first main electrode 28 is applied between the both main electrodes 28, 29, a channel is formed in the upper surface and the side surfaces of the third semiconductor region 59 to which the control electrode 30 is opposed, and a current flows between the both main electrodes 28, 29 through the first semiconductor region 57, the channel, the drift region 60, and the second semiconductor region 58. The semiconductor device according to this embodiment is also a so-called lateral semiconductor device in which a current flows in the direction generally parallel to the major surface of the semiconductor substrate 25.

By forming the semiconductor layer 27 in a shape of pillar, fin, or thin line on the insulating layer 26, not only the upper surface but also the side surfaces of the third semiconductor region 59 can be provided with the channel, and reduction of ON resistance can be achieved. Moreover, in particular, in the case of forming the semiconductor layer 27 in a thin line shape, the capacity between the source gates and the capacity between the drain gates become small, and thereby, acceleration of switching can be achieved.

Furthermore, in this embodiment, as conductive materials buried in the insulating layer 26, control electrode portions 77 are provided. A control electrode portion 77 is provided in a pillar shape in a portion in the insulating layer 26 over which a semiconductor layer 27 is not provided and which is not opposed to a semiconductor layer 27, namely, in the insulating layer 26 that is a portion between the semiconductor layers 27 with a stripe shape.

The control electrode 30 is provided on the insulating layer 26 so as to surround the third semiconductor region 59. The control electrode portion 77 is buried in the insulating layer 26 under a portion of the control electrode 30 located laterally to the semiconductor layer 27 above the insulating layer 26.

For every one of the semiconductor layers 27, one pair of the conductive materials 77 is provided in the positional relation of sandwiching the semiconductor layer 27 from the both sides of the lateral direction thereof. The upper surface of the control electrode portion 77 is exposed onto the surface of the insulating layer 26, and the control electrode 30 is in contact with the exposed portion. For the control electrode portion 77, the same material as the control electrode 30 such as polycrystalline silicon or metal material is used.

The control electrode 30 and the control electrode portion 77 buried in the insulating layer 26 are electrically connected. Therefore, during switching-on in which a predetermined control voltage is applied to the control electrode 30, the electric field from the control electrode portion 77 buried in the insulating layer 26 can be made to act on the side of the back surface of the third semiconductor region 59 (which is the surface in the third semiconductor region 59 in contact with the insulating layer 26). As a result, the channel can also be formed in the back surface side of the third semiconductor region 59, and ON resistance can be more reduced. In this embodiment, as shown in FIG. 18B, an inversion layer (or accumulation layer) 70 can be formed in the upper surface, the side surfaces and the back surface of the third semiconductor region 59, and ON resistance can be more reduced.

In forming the control electrode portion 77 in the insulating layer 26, the control electrode portion 77 can be formed by a simple process of forming trenches by etching from the front surface sides of the portions in the insulating layer 26 that are not opposed to the semiconductor layer 27 and then burying conductive materials into the trenches. In particular, in a semiconductor layer 27 of a shape of thin line whose width of the lateral direction is fine, the distance between one pair of the control electrode portions 77 buried in the positional relation of sandwiching the semiconductor layer 27 from the lateral direction becomes small, and therefore, even when a conductive material does not exist in the position opposed to the back surface of the third semiconductor region 59, the electric field from the control electrode portion 77 buried laterally to the third semiconductor region 59 can be easily made to act on the entire back surface of the third semiconductor region 59.

Moreover, by controlling the potential in the back surface sides of the third semiconductor regions 59 through the control electrode portions 77 buried in the insulating layer 26, the effect of the potential of the semiconductor substrate 25 on the third semiconductor regions 59 can be suppressed. Thereby, thinning of the insulating layer 26 can be achieved, and warpage can be prevented.

Thirteenth Embodiment

Figure 19:
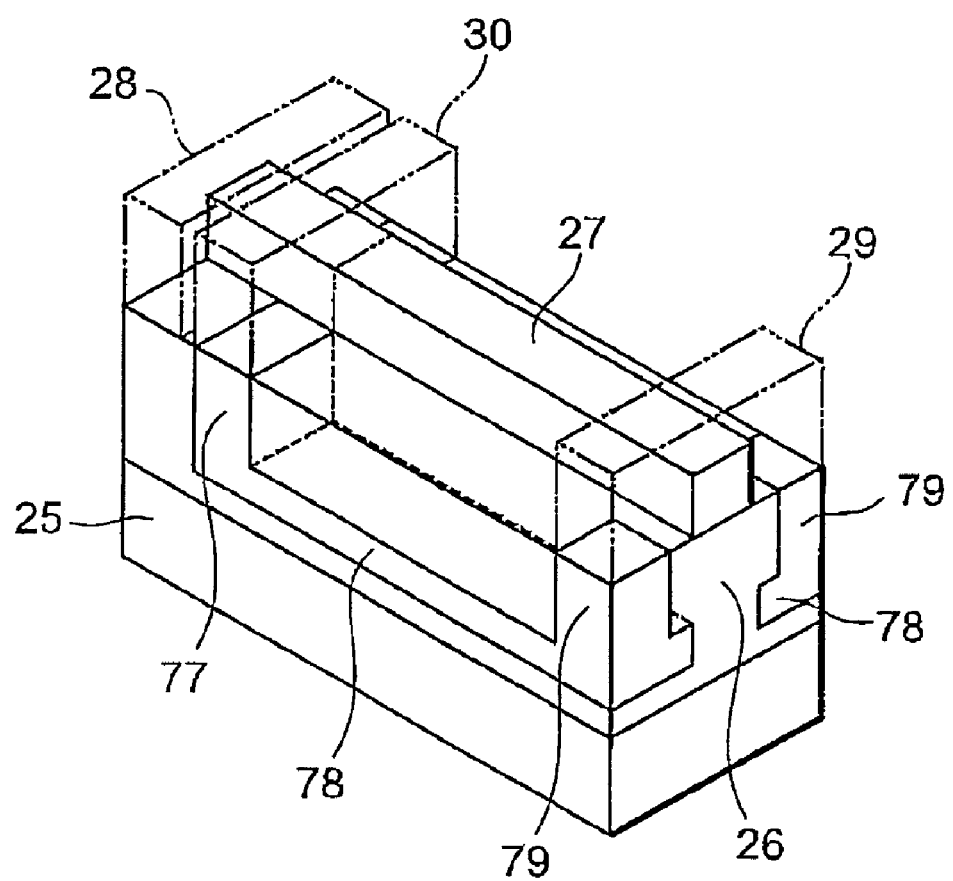
FIG. 19 is a schematic view illustrating the structure of the main part of the semiconductor device according to a thirteenth embodiment of the invention.

FIG. 19 is a schematic view showing a substantial structure in the semiconductor device according to the thirteenth embodiment of the invention. The semiconductor device according to this embodiment is the same MOSFET as the above-described twelfth embodiment, and the same signs are appended to the common parts to those of the semiconductor device according to the twelfth embodiment.

In this embodiment, a conductive material buried in the insulating layer 26 has a control electrode portion 77 and a field plate portion 78. A control electrode portion 77 is provided in a pillar shape in a portion in the insulating layer 26 which is not opposed to a semiconductor layer 27, namely, in the insulating layer 26 that is a portion between the semiconductor layers 27 with a stripe shape.

The control electrode 30 is provided on the insulating layer 26 so as to surround the third semiconductor region 59. The control electrode portion 77 is buried in the insulating layer 26 under a portion of the control electrode 30 located laterally to the semiconductor layer 27 above the insulating layer 26. The upper surface of the control electrode portion 77 is exposed onto the surface of the insulating layer 26, and the control electrode 30 is in contact with the exposed portion.

The control electrode 30 and the control electrode portion 77 buried in the insulating layer 26 are electrically connected. Therefore, during switching-on in which a predetermined control voltage is applied to the control electrode 30, the electric field from the control electrode portion 77 buried in the insulating layer 26 can be made to act on the side of the back surface of the third semiconductor region 59 (which is the surface in the third semiconductor region 59 in contact with the insulating layer 26). As a result, the channel can also be formed in the back surface side of the third semiconductor region 59, and ON resistance can be more reduced.

The field plate portion 78 is also provided in a portion in the insulating layer 26 which is not opposed to a semiconductor layer 27, namely, in the insulating layer 26 that is a portion between the semiconductor layers 27 with a stripe shape. The field plate portion 78 extends in the direction generally parallel to the longitudinal direction of the semiconductor layers 27 and is buried in the insulating layer 26.

One end in the longitudinal direction of the field plate portion 78 is connected to the control electrode 77, and the other end is connected to the connective portion 79. The connective portion 79 is formed in the insulating layer 26 in a pillar shape of extending onto the surface of the insulating layer 26 from the other end of the field plate portion 78. The upper surface of the connective portion 79 is exposed onto the surface of the insulating layer 26, and the second main electrode 29 is in contact with the exposed portion.

The field plate portions 78 can be formed by the same method as the above-described method of forming the conductive material 75 with reference to FIG. 16.

As a material for the field plate portions 78, a material such as polycrystalline silicon or semi-insulated polycrystalline silicon (SIPOS), which is more resistive than the metal material, for example, used for the first main electrode 28 and the second main electrode 29.

One end of a field plate portion 78 is connected to the control electrode 30 through the control electrode portion 77, and the other end of the field plate portion 78 is connected to the second main electrode 29 through the connective portion 79. However, because the field plate portion 78 is formed from a material of relatively high resistance, leak current between the control electrode 30 and the second main electrode 29 can be reduced to a practically negligible level.

The both ends of the longitudinal direction of the field plate portion 78 are connected to the control electrode 30 in the lower potential side and to the second main electrode 29 in the higher potential side, respectively. Hence, during switching-off of the control electrode 30, one end of the field plate portion 78 is placed at a lower potential and the other end is placed at a higher potential. The portion of the field plate portion 78 other than its both ends has a potential distribution corresponding to the path length from the ends. That is, in the field plate portion 78, a gradual potential distribution in the longitudinal direction connecting the control electrode 30 with the second main electrode 29 can be obtained. The one end of the field plate portion 78 is sufficient to be connected to the electrode to be a lower potential than that of the second main electrode 29, and is not limited to the control electrode 30 and may be connected to the first main electrode 28.

The field plate portion 78 is buried in the insulating layer 26. Therefore, the above-described electric field from the field plate portion 78 is made to act on the back surface side of the semiconductor layer 27 (particularly the drift region 60) and thereby the potential in the side of the back surface of the semiconductor layer 27 during switching-off can be controlled.

The field plate portion 78 extends in the longitudinal direction connecting the high potential side and the low potential side in the semiconductor layer 27, and in the field plate portion 78, a gradual potential distribution is generated in the longitudinal direction as described above. Hence, a depletion layer can be made to extend in the longitudinal direction in the back surface side of the semiconductor layer 27 during switching-off, and a high breakdown voltage can be obtained by suppressing local concentration of the electric field.

In this embodiment, the field plate portions 78 can be buried in the insulating layer 26 by a simple process of forming trenches in the portions of the insulating layer 26 lateral to the semiconductor layers 27, in which the semiconductor layer 27 is not provided, and then burying the field plate portions 78 thereinto. And, the electric field from the field plate portion 78 can be made to come round to and act on the back surface side of the semiconductor layer 27. In particular, in a semiconductor layer 27 of a shape of thin line whose width of the lateral direction is fine, the distance between one pair of the field plate portions 78 buried in the positional relation of sandwiching the semiconductor layer 27 from the lateral direction becomes small, and therefore, even when a conductive material does not exist in the position opposed to the back surface of the semiconductor layer 27, the electric field from the field plate portion 78 buried laterally to the semiconductor layer 27 can be easily made to act on the entire back surface of the semiconductor layer 27.

By controlling the potential in the back surface sides of the semiconductor layers 27 through the control electrode portion 77 or the field plate portion 78 buried in the insulating layer 26, the effect of the potential of the semiconductor substrate 25 on the semiconductor layer 27 can be suppressed. Thereby, thinning of the insulating layer 26 can be achieved, and warpage can be prevented.

Fourteenth Embodiment

Figure 20:
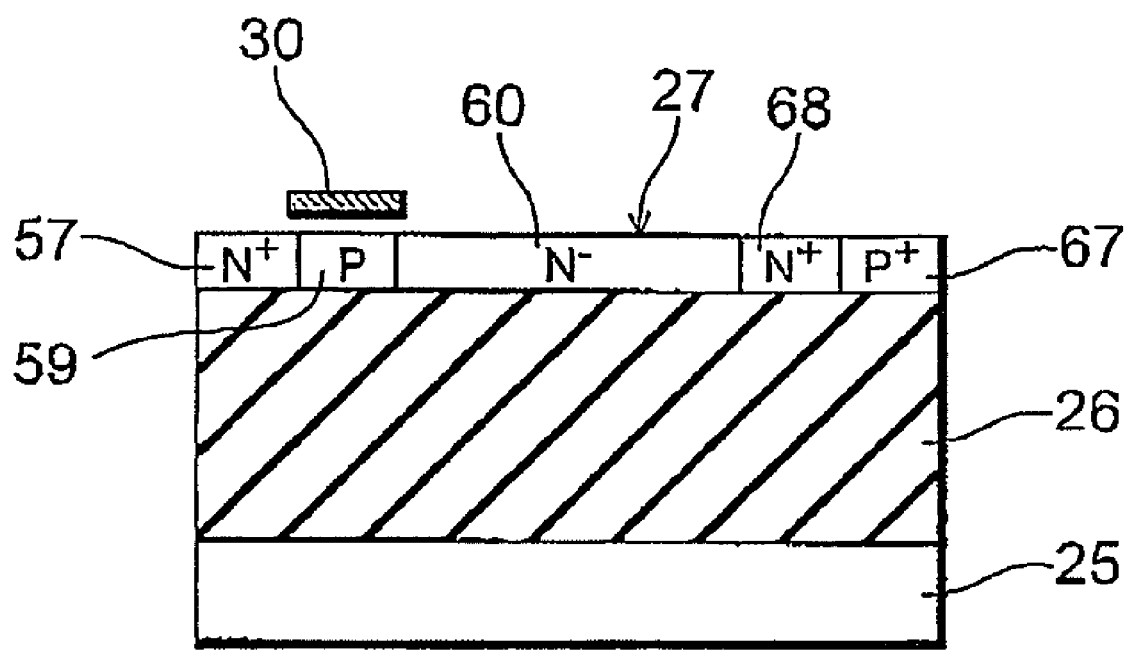
FIG. 20 is a schematic view illustrating the cross-sectional structure of the main part of the semiconductor device according to a fourteenth embodiment of the invention.

MOSFET is described in the twelfth embodiment and the thirteenth embodiment, but an insulated gate bipolar transistor (IGBT) as shown in FIG. 20 is also possible.

In IGBT, a second semiconductor region 67 connected to the second main electrode 29 in the high potential side is $P^+$ type, and an $N^+$ type buffer region 68 is formed between the second semiconductor region 67 and the drift region 60. The second semiconductor region 67 and the buffer region 68 form a PN junction.

In this IGBT, during switching-on in which a predetermined control voltage is applied to the control electrode 30, electrons are injected from the first semiconductor region 57 and positive holes are injected from the second semiconductor region 67, and thereby carriers are accumulated in the drift region 60 to cause conductivity modulation. Thus the ON resistance can be reduced.

Fifteenth Embodiment

Figure 21:
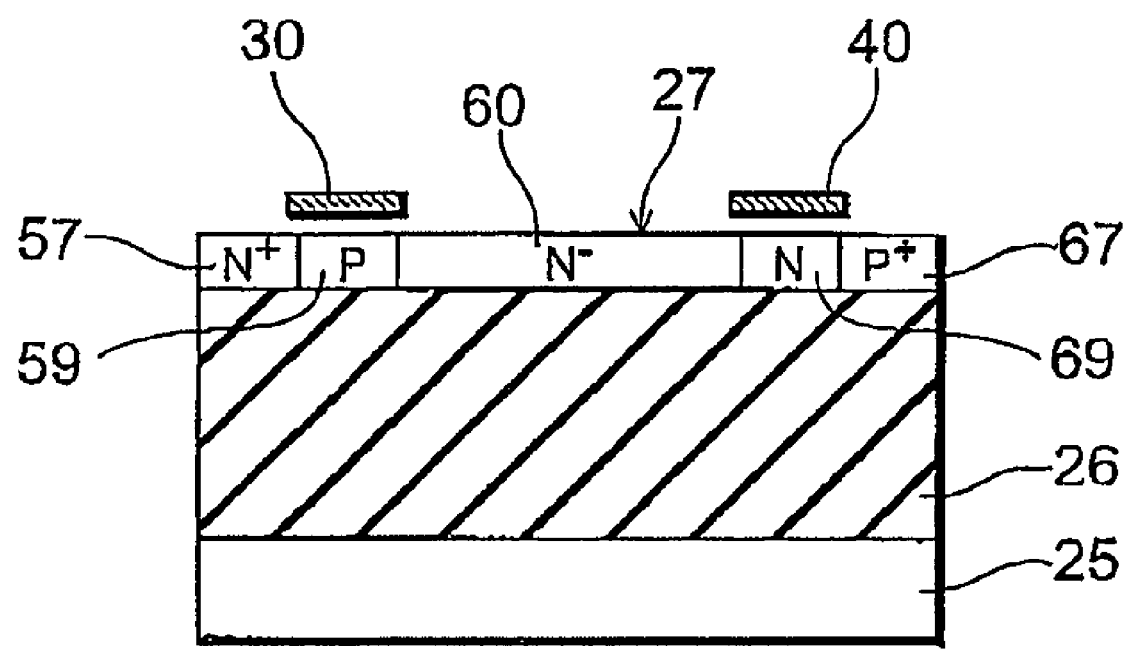
FIG. 21 is a schematic view illustrating the cross-sectional structure of the main part of the semiconductor device according to a fifteenth embodiment of the invention.

Moreover, in IGBT, as shown in FIG. 21, a control electrode 40 opposed to an N-type buffer region 69 through an insulator film may be provided. During switching-on, a P-type channel is formed in the buffer region 69 by the control voltage from the control electrode 40, and thereby, it is possible to promote injection of positive holes from the second semiconductor region 67 to the drift region 60.

In this configuration, when a conductive material connected to the control electrode 40 is provided in the insulating layer 26, a control voltage of the control electrode 40 can also be made to act on the back surface side of the buffer region 69 through the conductive material, and the channel is also formed in the back surface side of the buffer region 69, and thereby, reduction of ON resistance can be achieved.

In addition, the invention is applicable to an injection enhanced gate transistor (IEGT), a high electron mobility transistor (HEMT), and so forth. Furthermore, the invention is also applicable to an optical element such as optical waveguide, light-emitting diode, or semiconductor laser. When virtual back gate structure illustrated by the embodiment of the invention is applied to the optical elements, emission, light absorption, polarization, other optical property in the semiconductor layer can be effectively modulated (controlled) by action of an inversion layer, an accumulation layer, free carrier, the electric field generated in the back side of the semiconductor layer. Alternatively, when virtual field plate structure illustrated by the embodiment of the invention is applied to the optical elements, high voltage can be effectively applied to the optical elements. Also, when the virtual field plate structure is applied to the optical elements, the modulation generated by the potential difference between the potential of the optical element portion and the potential, such as substrate potential or potential of a control circuit, of the portion other than the optical element can be blocked or suppressed.

Sixteenth Embodiment

Figure 22:
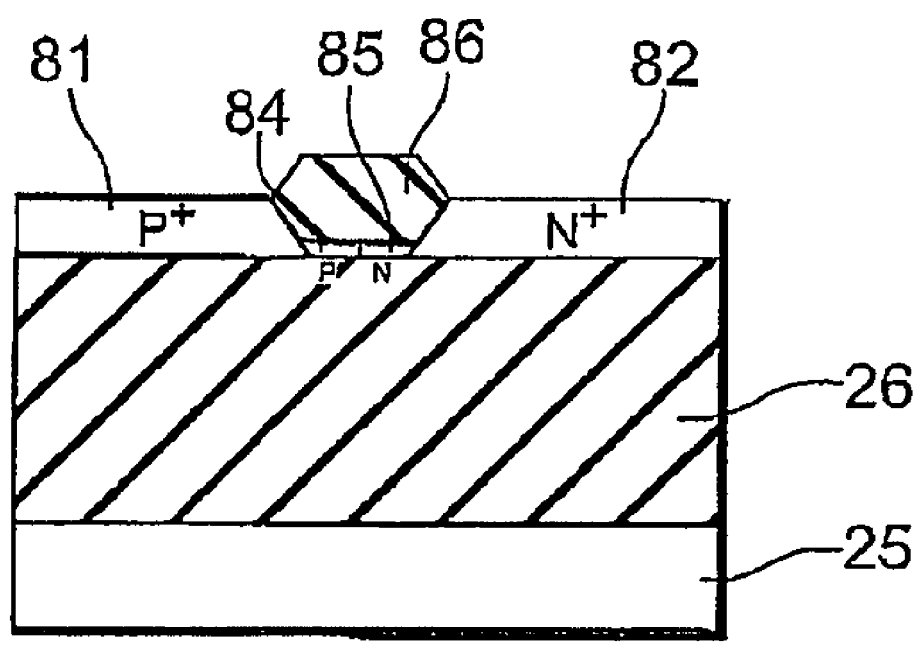
FIG. 22 is a schematic view illustrating the cross-sectional structure of the main part of the semiconductor device according to a sixteenth embodiment of the invention.

FIG. 22 schematically shows a structure of light-emitting element in which as the semiconductor material, for example, silicon is used.

A semiconductor layer is provided on the semiconductor layer 25 through the insulating layer 26, and in the semiconductor layer, a P$^+$-type first semiconductor region 81 and an N$^+$-type second semiconductor region 82 are formed, and the vicinity including the PN junction plane of these semiconductor regions is thinned by a LOCOS (local oxidation of silicon) process. The pn homojunction in this thinned silicon layer (p-type region 84 and n-type region 85) comes to have a light-emitting characteristic. This is the effect due to generation of quantum confinement of carriers because the extremely thin silicon layer is sandwiched between the silicon oxide film 86 and the silicon oxide film 26.

Figure 23A:
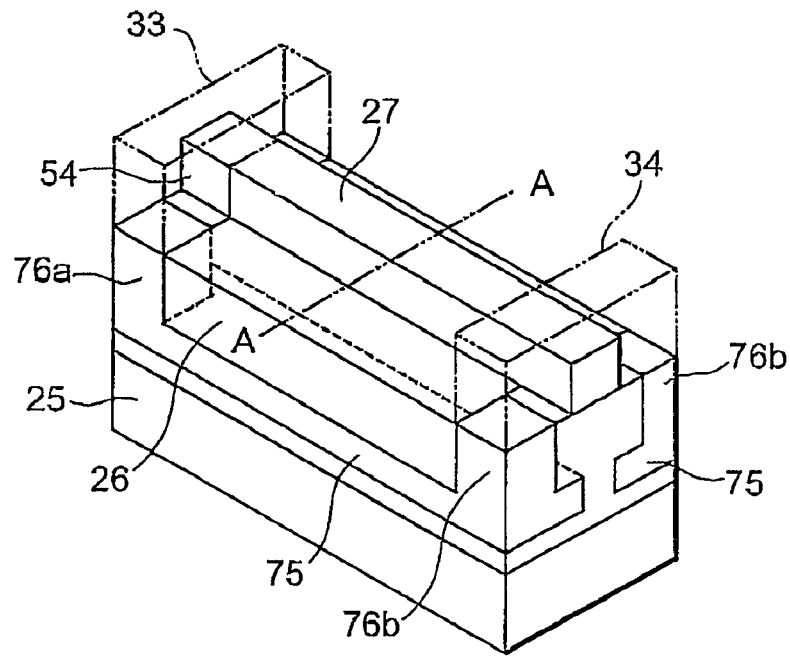
FIG. 23A is a schematic view showing a variation of the semiconductor device according to the embodiment of the invention.
Figure 23B:
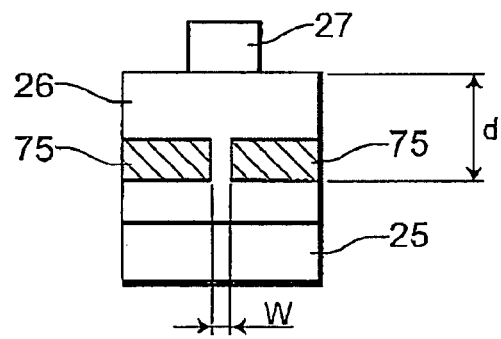
FIG. 23B is a cross-sectional view taken along the line A-A in FIG. 23A.

Here, FIG. 23A is a view corresponding to the above-described FIG. 14A. FIG. 23B is a cross section view of A-A in FIG. 23A. In the structure shown in FIG. 23, a conductive material 75 buried in the insulating layer 26 protrudes over a portion opposed to the back surface of the semiconductor layer 27.

For example, in the step of FIG. 16B of forming trenches in the insulating layer 26, the trenches extending also under the semiconductor layer 27 can be formed by performing isotropic etching, and the structure shown in FIG. 23 is possible by burying the conductive materials 75 in the trenches.

Figure 23C:
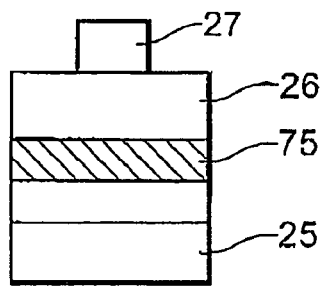
FIG. 23C is a schematic cross-sectional view showing a variation of the semiconductor device according to the embodiment of the invention.

In the case of this structure, the conductive materials 75 are also buried in portions opposed to the back surfaces of the semiconductor layers 27, and therefore, the electric field from the conductive materials 75 can be easily made to act on the entire back surface of the semiconductor layers 27. Alternatively, as shown in FIG. 23C, the conductive materials 75 may be buried on the entire under the semiconductor layer 27.

Figure 24:
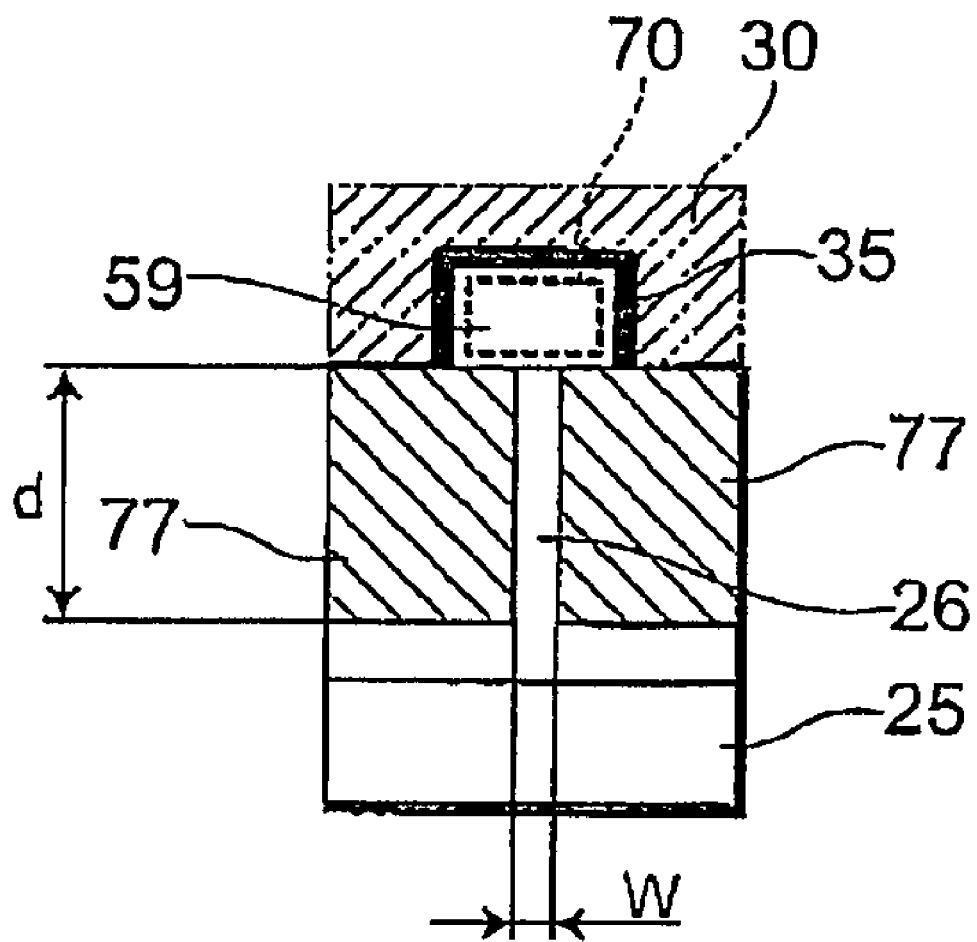
FIG. 24 is a schematic cross-sectional view showing a variation of the semiconductor device according to the embodiment of the invention.

Moreover, FIG. 24 is a view corresponding to FIG. 18B. In the structure shown in FIG. 24, control electrode portions 77 buried in the insulating layer 26 protrude over a portion opposed to the back surface of a third semiconductor region 59. The electric field from the control electrode portion 77 can be easily made to act on the entire back surface of the third semiconductor region 59. Alternatively, the control electrode portion 77 may be buried on the entire under the third semiconductor region 59. An insulating film is provided between the back surface of the third semiconductor region 59 and the control electrode portion 77. Alternatively, the insulating film provided between the back surface of the third semiconductor region 59 and the control electrode portion 77 may be omitted when the control electrode portion 77 is made of a high-resistance material such as SIPOS (semi-insulated polycrystalline silicon).

In each of the above-described embodiments, the conductive materials are not buried over the entire region of the insulating layer but trenches are formed in only necessary portions and the conductive materials are selectively buried. Accordingly, only necessary portions in the back surface sides can be locally subjected to potential control, and thereby, adverse affect due to the effect of the electric field from the conductive materials on unnecessary portions can be avoided.

Let d be a depth of the buried layer (conductive materials) and let W be a distance between one pair of the buried layers buried in the positional relation of sandwiching the semiconductor layer, as shown in FIGS. 14B and 18B. It is preferable that d≧W. The deeper d and the shorter W, the more equally the potential of the buried layer can be made to act the boundary surface between the semiconductor layer 27 and the insulating layer 26. Also the deeper d and the shorter W, the more effectively the buried layer blocks the substrate potential.

The buried layer connected to the surface side control electrode functions as a virtual back gate, and generates the inversion layer or the accumulation layer in the back surface side of the semiconductor layer.

In contrast, the buried layer provided as field plate blocks the effect of the substrate potential on the semiconductor layer. Thus the inversion layer or the accumulation layer, in the semiconductor layer, caused by the potential difference between the substrate potential (such as ground potential) and the high-potential side in the semiconductor layer can be prevented, and the breakdown voltage can be improved.

As described above, the embodiments of the invention has been described with reference to specific examples. However, the invention is not limited thereto, and various modifications are possible based on the technical idea of the invention.

The semiconductor layer in an SOI structure is not limited to Si, but compound semiconductors such as GaN and SiC, Ge, and so forth are possible.

If there is no trouble in transfer or handling, the constitution in which the semiconductor substrate is not provided or some of the substrate is removed is also possible.

Let Ir be a current passing the field plate and let Ids be a leak current passing the semiconductor layer. Here is a design example of Ir relative to Ids when a blocking voltage is applied to the main electrodes of the semiconductor portion. This is applicable to all embodiments including the virtual field plate structure. In case of necessity of low leak current when electrostatic breakdown voltage is applied, structure or material of the virtual field plate is preferably designed so that Ir=0, Ir≪Ids, Ir<Ids or Ir is nearly equal to Ids. In case that dynamic characteristics (such as reverse recovery characteristics, switching characteristics, switching loss, switching speed) of the semiconductor device or thickness of the buried insulating layer (operational stability in the thinner buried oxide film structure) is valued, it may be designed so that Ir is nearly equal to Ids, Ir=Ids, Ir>Ids or Ir≫Ids.

The invention claimed is:

1. A semiconductor device comprising:
a first insulating layer;
a semiconductor layer provided on the first insulating layer;
a first semiconductor region selectively provided in the semiconductor layer;
a second semiconductor region selectively provided in the semiconductor layer and spaced from the first semiconductor region;
a first main electrode provided in contact with the first semiconductor region;
a second main electrode provided in contact with the second semiconductor a second insulating layer provided on the semiconductor layer;
a first conductive material provided in the second insulating layer above a portion of the semiconductor layer located between the first semiconductor region and the second semiconductor region; and
a second conductive material provided in a trench, passing through the semiconductor layer, directly contacting the first insulating layer, and being in contact with the first conductive material,
one end of the first conductive material being connected to the first main electrode, and the other end being connected to the second main electrode.

2. A semiconductor device comprising:
a first insulating layer;
a semiconductor layer provided on the first insulating layer;
a first semiconductor region selectively provided in the semiconductor layer;
a second semiconductor region selectively provided in the semiconductor layer and spaced from the first semiconductor region;
a third semiconductor region provided in the semiconductor layer, being in contact with the first semiconductor region, and having a conductivity type opposite to that of the first semiconductor region;
a first main electrode provided in contact with the first semiconductor region;
a second main electrode provided in contact with the second semiconductor region;
a second insulating layer provided on the semiconductor layer;
a first conductive material provided in the second insulating layer above a portion of the semiconductor layer located between the first semiconductor region and the second semiconductor region, the first conductive material including a control electrode portion provided above the third semiconductor region;
a second conductive material provided in a trench, passing through the semiconductor layer, directly contacting the first insulating layer, and being in contact with the first conductive material, and provided in a trench provided in a portion of the third semiconductor region opposed to the control electrode portion and has a bottom on the first insulating layer side.

3. The semiconductor device according to claim 2, wherein the first conductive material further includes a field plate portion, one end of the field plate portion being connected to the control electrode portion, and the other end being connected to the second main electrode.

4. The semiconductor device according to claim 3, wherein the field plate portion is made of a material having a higher resistance than those of the first main electrode and the second main electrode.

5. The semiconductor device according to claim 2, wherein the first conductive material further includes a field plate portion, one end of the field plate portion being connected to the first main electrode, and the other end being connected to the second main electrode.

6. The semiconductor device according to claim 5, wherein the field plate portion is made of a material having a higher resistance than those of the first main electrode and the second main electrode.

7. A semiconductor device comprising:
an insulating layer;
a semiconductor layer provided on the insulating layer;
a first semiconductor region selectively provided in the semiconductor layer;
a second semiconductor region selectively provided in the semiconductor layer and spaced from the first semiconductor region;
a first main electrode provided in contact with the first semiconductor region;
a second main electrode provided in contact with the second semiconductor region;
a conductive material selectively provided in a portion that does not overlap the area directly below the semiconductor layer, in the insulator layer;
wherein the conductive material is provided in the insulating layer below the semiconductor layer.

8. A semiconductor device comprising:
an insulating layer;
a semiconductor layer provided on the insulating layer;
a first semiconductor region selectively provided in the semiconductor layer;
a second semiconductor region selectively provided in the semiconductor layer and spaced from the first semiconductor region;
a first main electrode provided in contact with the first semiconductor region;
a second main electrode provided in contact with the second semiconductor region;
a conductive material selectively provided in a portion that does not overlap the area directly below the semiconductor layer, in the insulator layer,
one end of the conductive material being connected to the first main electrode and the other end being connected to the second main electrode.

9. The semiconductor device according to claim 8, wherein the conductive material is made of a material having a higher resistance than those of the first main electrode and the second main electrode.

10. A semiconductor device comprising:
an insulating layer;
a semiconductor layer provided on the insulating layer;
a first semiconductor region selectively provided in the semiconductor layer;
a second semiconductor region selectively provided in the semiconductor layer and spaced from the first semiconductor region;
a third semiconductor region provided in the semiconductor layer, being in contact with the first semiconductor region, and having a conductivity type opposite to that of the first semiconductor region;

a first main electrode provided in contact with the first semiconductor region;

a second main electrode provided in contact with the second semiconductor region;

a conductive material selectively provided in a portion that does not overlap the area directly below the semiconductor layer, in the insulator layer, the conductive material including a first control electrode portion that is provided in the insulating layer under a second portion of the control electrode provided above the insulating layer and that is in contact with the control electrode.

11. The semiconductor device according to claim 10, wherein the conductive material further includes a field plate portion, one end of the field plate portion being connected to the control electrode, and the other end being connected to the second main electrode.

12. The semiconductor device according to claim 11, wherein the field plate portion is made of a material having a higher resistance than those of the first main electrode and the second main electrode.

13. The semiconductor device according to claim 10, wherein the conductive material further includes a field plate portion, one end of the field plate portion being connected to the first main electrode, and the other end being connected to the second main electrode.

14. The semiconductor device according to claim 13, wherein the field plate portion is made of a material having a higher resistance than those of the first main electrode and the second main electrode.

* * * * *